(12) United States Patent
Ikeda et al.

(10) Patent No.: US 9,159,750 B2
(45) Date of Patent: Oct. 13, 2015

(54) SOLID-STATE IMAGE SENSING DEVICE

(71) Applicant: Canon Kabushiki Kaisha, Tokyo (JP)

(72) Inventors: Yasuji Ikeda, Kawasaki (JP); Seiji Hashimoto, Yokohama (JP); Takashi Muto, Kawasaki (JP); Yasushi Matsuno, Fujisawa (JP); Daisuke Yoshida, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 40 days.

(21) Appl. No.: 13/757,422

(22) Filed: Feb. 1, 2013

(65) Prior Publication Data
US 2013/0206961 A1    Aug. 15, 2013

(30) Foreign Application Priority Data

Feb. 9, 2012 (JP) .................. 2012-026422
Jan. 16, 2013 (JP) .................. 2013-005708

(51) Int. Cl.
H01L 27/00 (2006.01)
H01L 27/146 (2006.01)
H04N 5/378 (2011.01)

(52) U.S. Cl.
CPC ......... H01L 27/14601 (2013.01); H04N 5/378 (2013.01)

(58) Field of Classification Search
CPC .. H01L 27/14609; H04N 5/369; H04N 5/374; H04N 5/378

USPC ............. 250/208.1, 214 R, 214 DC, 214 A, 250/214 LA, 214 LS; 348/300, 302, 303, 348/308, 322; 341/155, 158, 164, 169
See application file for complete search history.

(56) References Cited

U.S. PATENT DOCUMENTS 7,321,329 B2    1/2008    Tooyama et al.
7,471,230 B2    12/2008   Tooyama et al.
(Continued)

FOREIGN PATENT DOCUMENTS

CN    1917374 A    2/2007
CN    101231626 A   7/2008
(Continued)

OTHER PUBLICATIONS

Aug. 5, 2015 Chinese Office Action concerning corresponding Chinese Patent Application No. 201310049957.0.

*Primary Examiner* — Kevin Pyo
(74) *Attorney, Agent, or Firm* — Fitzpatrick, Cella, Harper & Scinto

(57) ABSTRACT

An image sensor comprises plural sets of a unit pixel outputting a pixel signal based on an electric charge generated through photoelectric conversion and a conversion unit converting the pixel signal into a digital signal. A reference signal source generates reference signals and supplies the generated reference signals to the conversion unit through signal lines. The conversion unit of each set comprises a comparator which compares the level of the reference signal with that of the pixel signal, a count circuit which counts a clock based on the comparison processing, a selection circuit which selects, among the signal lines, a signal line to be selectively connected to the input of the comparator, and a switch which selectively connects the selected signal line to the input of the comparator, and selectively connects a load to an unselected one of the signal lines.

15 Claims, 26 Drawing Sheets

(56) References Cited

U.S. PATENT DOCUMENTS

| | | | |
|---|---|---|---|
| 7,595,656 B2 | 9/2009 | Hayami et al. | |
| 7,705,897 B2 | 4/2010 | Muramatsu | 348/294 |
| 7,973,695 B2 * | 7/2011 | Kudo | 341/169 |
| 8,189,086 B2 | 5/2012 | Hashimoto et al. | 348/300 |
| 8,310,576 B2 | 11/2012 | Hashimoto et al. | 348/300 |
| 8,400,546 B2 | 3/2013 | Itano et al. | 348/308 |
| 8,885,084 B2 | 11/2014 | Egawa | |
| 2011/0279723 A1 | 11/2011 | Takamiya et al. | |
| 2011/0309235 A1 | 12/2011 | Yoshida | 250/208.1 |
| 2012/0261552 A1 | 10/2012 | Ikeda | 250/208.1 |
| 2012/0327279 A1 | 12/2012 | Hashimoto et al. | 348/300 |
| 2013/0162874 A1 | 6/2013 | Hashimoto et al. | 348/300 |
| 2014/0320713 A1 | 10/2014 | Egawa | |

FOREIGN PATENT DOCUMENTS

| | | |
|---|---|---|
| CN | 101917193 A | 12/2010 |
| CN | 102244742 A | 11/2011 |
| CN | 102281402 A | 12/2011 |
| JP | 2006-352597 A | 12/2006 |
| JP | 2007-281987 A | 10/2007 |

* cited by examiner

F I G. 2
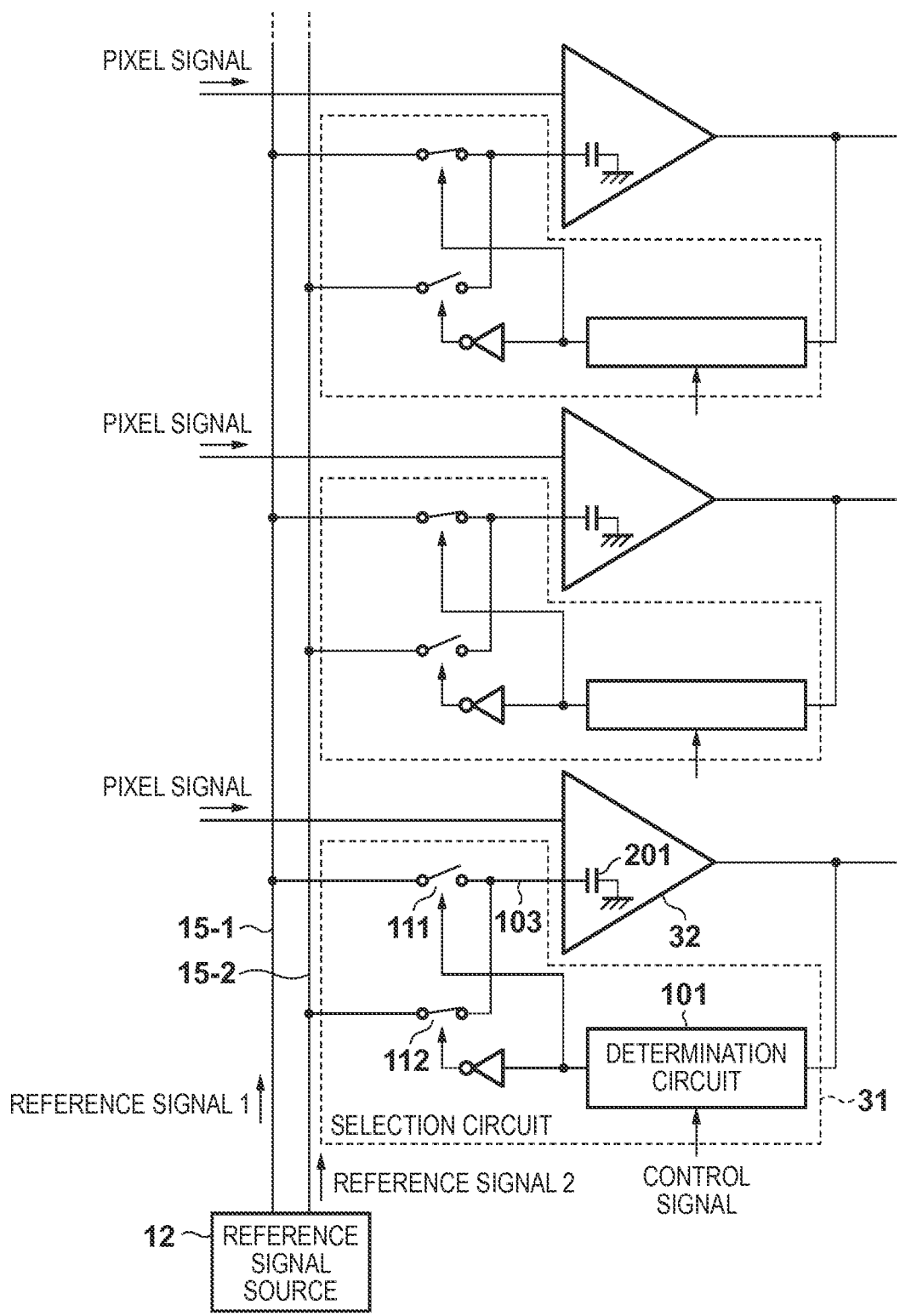

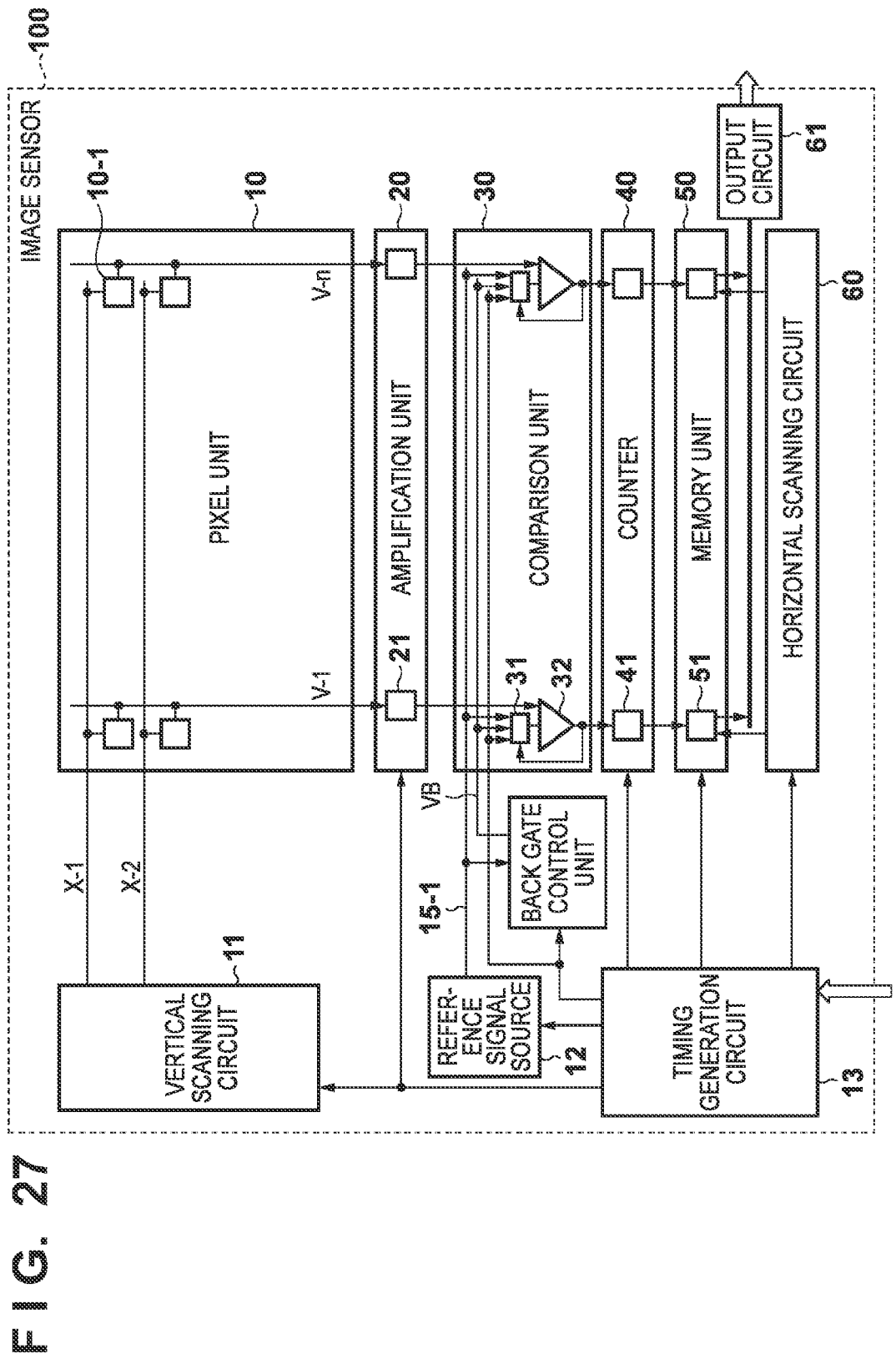
F I G. 27

SOLID-STATE IMAGE SENSING DEVICE

BACKGROUND OF THE INVENTION

1. Field of the Invention

The present invention relates to a solid-state image sensing device and, more particularly, to a solid-state image sensing device including analog to digital converting units.

2. Description of the Related Art

A CMOS image sensor including an A/D converter (to be referred to as a "column ADC" hereinafter) for performing analog to digital (A/D) conversion for each column of unit pixels arranged in a matrix topology is used as a solid-state image sensing device. As an A/D conversion method, a plurality of comparators are used to respectively compare pixel signals with reference signals which have different rates of change with respect to time, thereby performing A/D conversion based on comparison times (see Japanese Patent Laid-Open No. 2007-281987 (literature 1)).

Furthermore, there is provided a method of selecting, among a plurality of reference signals each with a ramp voltage, a reference signal appropriate for a pixel signal based on a pixel signal level determination result, and comparing the selected reference signal and the pixel signal with each other, thereby performing A/D conversion based on a comparison time (see Japanese Patent Laid-Open No. 2006-352597 (literature 2)).

For the method using the plurality of comparators described in literature 1, however, the circuit scale is large. Furthermore, literature 2 does not describe a method of supplying a plurality of reference signals when comparing the pixel signal with the reference signal which has been selected from the plurality of reference signals each with a ramp voltage.

SUMMARY OF THE INVENTION

In one aspect, a solid-state image sensing device having plural sets of a unit pixel outputting a pixel signal, and a conversion unit converting the pixel signal into a digital signal, the device comprising a reference signal generator configured to generate a plurality of reference signals, and to supply the plurality of reference signals to the conversion unit through a corresponding one of a plurality of signal lines, wherein the conversion unit of each set comprises: a comparator configured to compare a level of the reference signal with a level of the pixel signal; a counter configured to count a clock based on the comparison; a selector configured to select, among the plurality of signal lines, a signal line to be connected to an input of the comparator; and a connecting unit configured to selectively connect the selected signal line to the input of the comparator, and to selectively connect a load to an unselected signal line of the plurality of signal lines.

In another aspect, a solid-state image sensing device having plural sets of a unit pixel outputting a pixel signal, and a conversion unit converting the pixel signal into a digital signal, the device comprising a reference signal generator configured to generate a plurality of reference signals, and to supply the plurality of reference signals to the conversion unit, wherein the conversion unit of each set comprises: a comparator configured to compare a level of the reference signal with a level of the pixel signal; and a counter configured to count a clock based on the comparison, and wherein the comparator comprises: a plurality of reference signal inputting units configured to respectively input the plurality of reference signals; and a selector configured to selectively enable an input operation of one of the plurality of reference signal inputting units.

According to these aspects, it is possible to compare a pixel signal with different reference signals to convert the pixel signal into a digital signal with high accuracy while suppressing the circuit scale.

Further features of the present invention will become apparent from the following description of exemplary embodiments with reference to the attached drawings.

BRIEF DESCRIPTION OF THE DRAWINGS

FIG. 2 is a circuit diagram for explaining the arrangement of a general selection circuit.

FIG. 27 is a circuit diagram for explaining the arrangement of an image sensor serving as a solid-state image sensing device according to the nineteenth embodiment.

DESCRIPTION OF THE EMBODIMENTS

A solid-state image sensing device and an analog to digital (A/D) converting method therefor according to an embodiment of the present invention will be described in detail below with reference to the accompanying drawings.

First Embodiment

[Device Arrangement]

Figure 1:
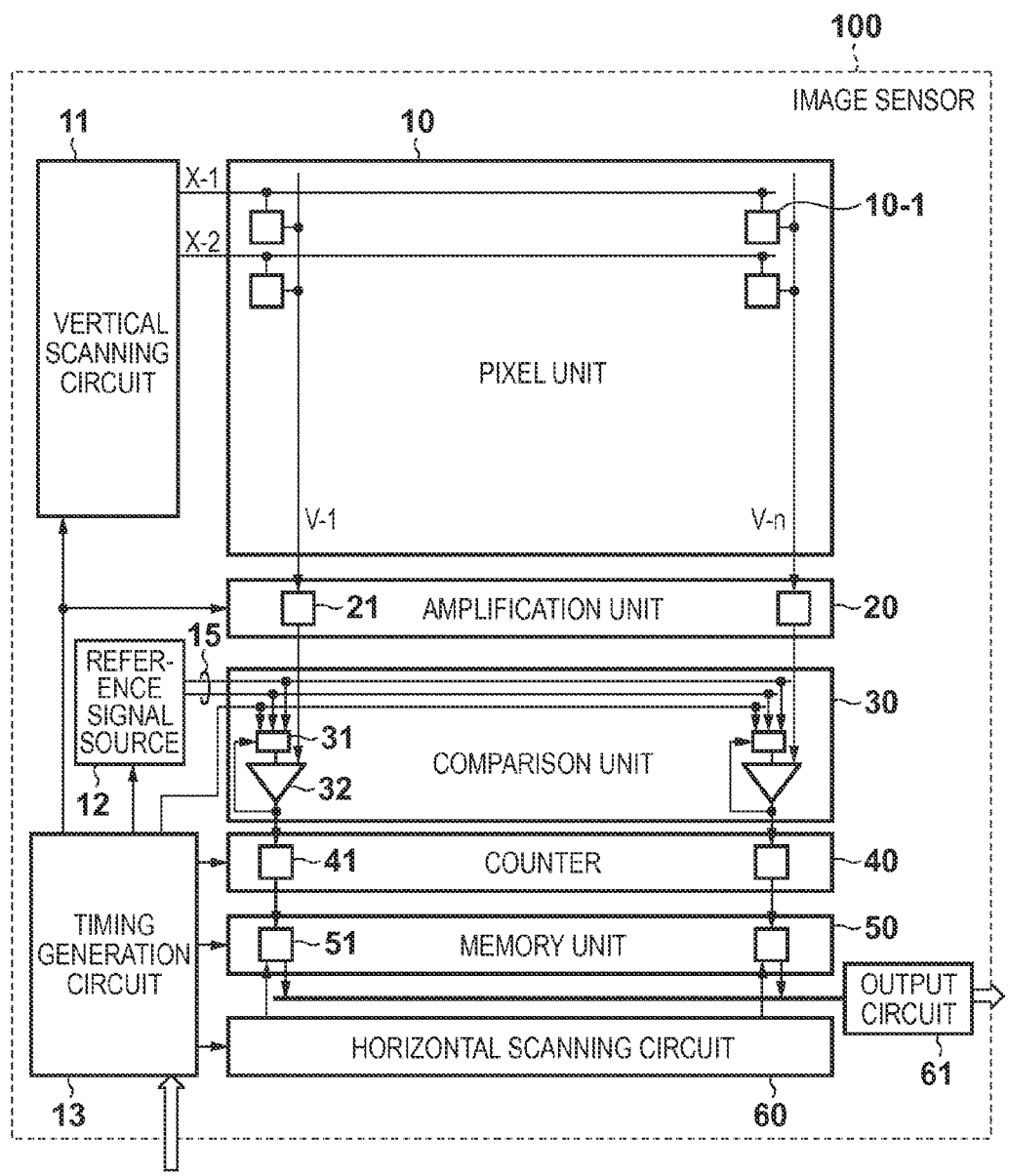
FIG. 1 is a circuit diagram for explaining the arrangement of an image sensor serving as a solid-state image sensing device according to an embodiment.

The arrangement of an image sensor 100 serving as a solid-state image sensing device according to an embodiment will be described with reference to a circuit diagram shown in FIG. 1. The image sensor 100 will be referred to as a CMOS image sensor, which performs photoelectric conversion on an object image obtained by receiving light, and outputs an electric signal as a digital signal. The image sensor 100 includes the following main circuit blocks.

A pixel unit 10 serves as a photoelectric conversion region. A vertical scanning circuit 11 scans the pixel unit 10. An amplification unit 20 amplifies an analog pixel signal output from the pixel unit 10. A reference signal source 12 serves as a reference signal generation unit that generates a reference signal with a ramp voltage, and the like.

A comparison unit 30 compares a pixel signal with a reference signal. A counter 40 counts the comparison period of the comparison unit 30 (details thereof will be described later). A memory unit 50 holds a count value, and performs a bit shift and calculation for held data. The comparison unit 30, counter 40, and memory unit 50 form the main part of an analog to digital converting unit (ADC).

A horizontal scanning circuit 60 scans the memory unit 50 to transfer data held in the memory unit 50 to an output circuit 61. A timing generation circuit (TG) 13 controls the operation timing of each of the above circuit blocks.

A plurality of unit pixels 10-1 are arranged in the pixel unit 10. FIG. 1, however, shows only four pixels for the sake of simplicity. The arrangement of the unit pixel 10-1 is well known, and a detailed description thereof will be omitted. Note that the unit pixel 10-1 includes a photoelectric conversion element, a pixel amplifier, a transfer switch for controlling to transfer an electric charge generated by the photoelectric conversion element to the gate electrode of the pixel amplifier, and a reset switch for resetting residual charges on the photoelectric conversion element and the gate electrode. Respective pixel rows are sequentially driven by driving pulses X-1, X-2, . . . output from the vertical scanning circuit 11, and the reset signals of the respective pixels and significant signals serving as photoelectric conversion signals are sent to the amplification unit 20 via a plurality of column signal lines V-1 to V-n.

Each of the units 20 to 50 includes a plurality of circuits, the number of which is equal to that of the column signal lines. Note hereinafter, a series of circuits corresponding to each column signal line may be referred to as a "column".

The amplification unit 20 includes a plurality of amplification circuits 21 corresponding to the respective columns.

Each amplification circuit 21 may have only a function of simply amplifying a signal input from the pixel, or may have a correlated double sampling (CDS) function of executing processing of obtaining a difference between the significant signal and the reset signal. Note that if no amplification unit 20 is provided, the inputting unit of the comparison unit 30 executes the CDS processing. Although the amplification unit 20 is not essential, amplifying a signal reduces the influence of noise generated by the comparison unit 30.

The reference signal source 12 includes a digital to analog converter (DAC), which generates a reference signal with a voltage which ramps up or a reference signal (to be referred to as a "determination reference signal" hereinafter) with a predetermined voltage, and supplies a plurality of reference signals or determination reference signals to all the columns via reference signal lines 15. Alternatively, the reference signal source 12 may supply a constant current to the reference signal lines 15 to charge the capacitances of the respective columns, thereby generating reference signals or determination reference signals.

The comparison unit 30 includes a plurality of sets of selection circuits 31 and comparators 32 corresponding to the respective columns. Each comparator 32 compares the reset signal of the pixel of a corresponding column with the reference signals, and then compares the significant signal of the pixel with a determination reference signal as a reference in selecting a reference signal. The selection circuit 31 serves as a selection unit for selecting a reference signal based on a comparison processing result. The comparator 32 compares the significant signal of the pixel with the selected reference signal.

The counter 40 includes a plurality of count circuits 41 each of which counts a clock supplied by the TG 13, and corresponds to each column. The count circuit 41 starts counting a clock when the corresponding comparator 32 starts processing of comparing the significant signal of the pixel with the selected reference signal, and stops counting the clock when the output signal of the comparator 32 is inverted (the comparison processing ends).

The memory unit 50 includes a plurality of memory circuits 51 corresponding to the respective columns. Each memory circuit 51 holds the count result of the corresponding count circuit 41 as an A/D conversion result. According to a scanning pulse input from the horizontal scanning circuit 60, the memory unit 50 transfers the data (A/D conversion result) held by each memory circuit 51 to the output circuit 61.

● Selection Circuit

The arrangement of each selection circuit 31 will be described with reference to a circuit diagram shown in FIG. 2.

The selection circuit 31 includes a determination circuit 101, and switches 111 and 112. The determination circuit 101 controls the open/closed states of the switches 111 and 112 according to a control signal input from the TG 13, and inputs reference signal 1 or 2 to the comparator 32 by switching the switches 111 and 112 based on the result of the processing of comparing the significant signal of the pixel with the determination reference signal by the comparator 32. Note that in a closed state of a switch, a signal or current can pass through the switch, and in an open state of the switch, the signal or current can not pass through the switch.

A capacitance 201 within the comparator 32 is a capacitance (to be referred to as a "load capacitance" hereinafter) serving as the load of a reference signal connection node 103. That is, the capacitance 201 is equivalent to the capacitance value of a capacitance (to be referred to as an "input capacitance") existing in the input of the comparator 32 and the capacitance value of a stray capacitance such as a wiring line.

Figure 3:
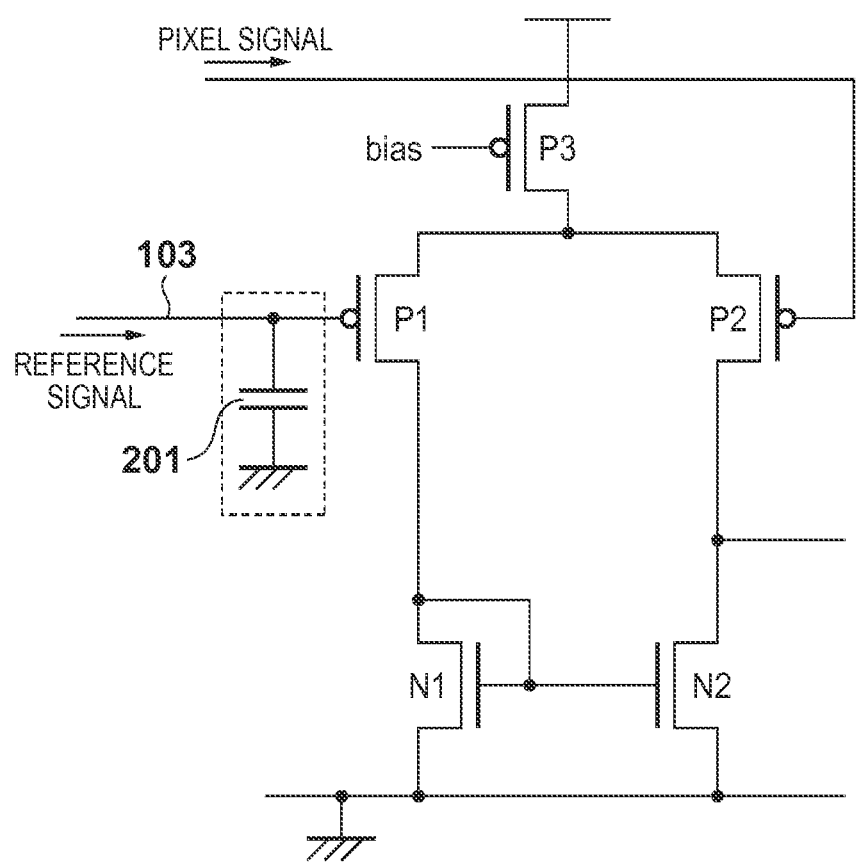
FIG. 3 is a circuit diagram showing the arrangement of a general comparator.

FIG. 3 shows the arrangement of the comparator 32. The reference signal connection node 103 is connected to the gate of a MOS transistor. There is a capacitance (gate capacitance) between another terminal and the gate of the MOS transistor. There is also a stray capacitance in the reference signal connection node 103. These capacitances will be collectively referred to as the load capacitance 201 of the reference signal connection node 103.

By forming the selection circuits 31 as shown in FIG. 2, the number of capacitances 201 connected to reference signal line 15-1 or 15-2 changes depending on the number of connections between the columns and the reference signal line 15-1 or 15-2 for each A/D conversion cycle. In other words, the load of each reference signal line changes for each A/D conversion cycle. As the load of the reference signal line 15-1 or 15-2 changes, the reference signal level in each column also changes, thereby deteriorating the accuracy of A/D conversion.

According to the embodiment, load variations of the reference signal lines are suppressed by connecting the same load, to the reference signal line which is not connected to the comparators 32, as that when it is connected. A case in which two reference signals are switched will be described. Even if, however, three or more reference signals are used, it is possible to suppress load variations by connecting the same load, to the reference signal line which is not connected to the comparators 32, as that when it is connected. The reference signals may have the same or different voltage ramp gradients.

Figure 4:
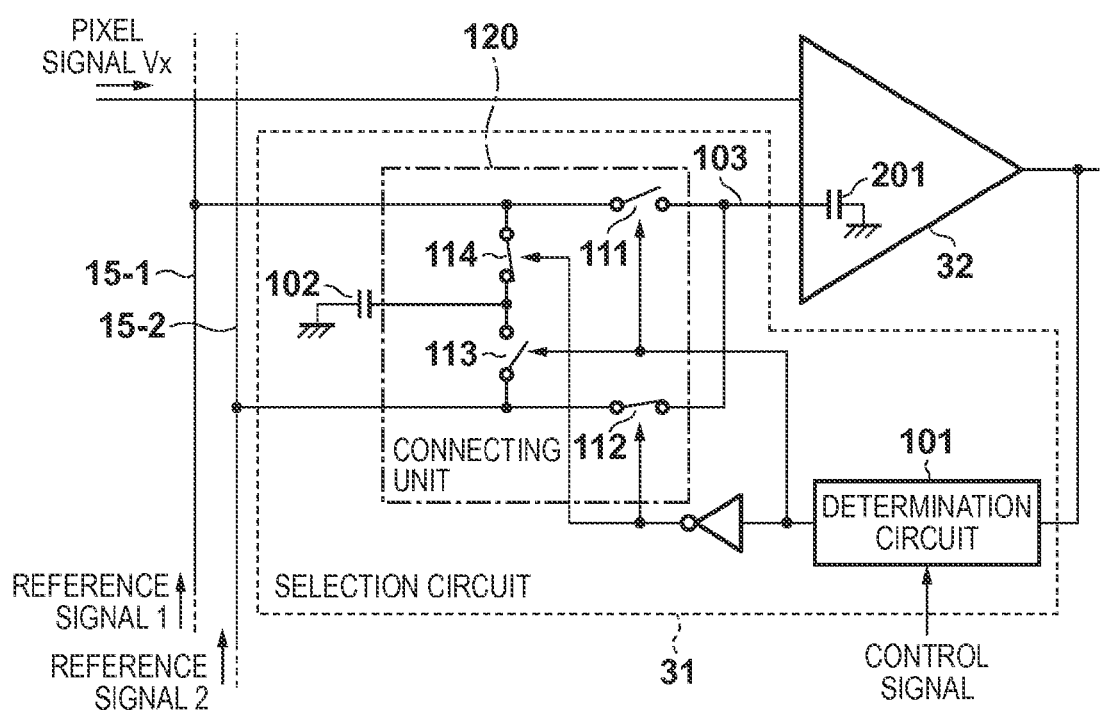
FIG. 4 is a circuit diagram showing the arrangement of a selection circuit according to the first embodiment.

The arrangement of the selection circuit 31 according to the first embodiment will be described with reference to a circuit diagram shown in FIG. 4.

The selection circuit 31 includes a determination circuit 101, and switches 111, 112, 113, and 114. The determination circuit 101 controls the open/closed states of the switches 111 to 114 according to a control signal input from the TG 13, and inputs reference signal 1 or 2 to the comparator 32 by switching the switches 111 to 114 based on the result of the processing of comparing the significant signal of the pixel with the determination reference signal by the comparator 32.

One end of each of the switches 111 and 112 is connected to the reference signal connection node 103. The other end of the switch 111 is connected to the reference signal line 15-1, and the other end of the switch 112 is connected to the reference signal line 15-2. One end of each of the switches 113 and 114 is connected to a ground potential GND through a capacitance 102. The other end of the switch 113 is connected to the reference signal line 15-2, and the other end of the switch 114 is connected to the reference signal line 15-1. The capacitance 102 has a capacitance value almost equal to that of the load capacitance 201. More specifically, the capacitance value of the capacitance 102 is determined so that the capacitance value when the reference signal line is connected to the input of the comparator 32 is almost equal to that when it is connected to the capacitance 102, in terms of the reference signal line.

Based on the result of the processing of comparing the significant signal of the pixel with the determination reference signal by the comparator 32, the determination circuit 101 controls the open/closed states of the switches 111 to 114 to selectively connect the reference signal line 15-1 or 15-2 to the reference signal connection node 103, and connects the capacitance 102 to the unselected reference signal line. That is, the switches 111 to 114 function as a connecting unit 120 which selectively connects the selected reference signal line to the reference signal connection node 103, and selectively connects the unselected reference signal line to the capacitance 102.

Figure 5:
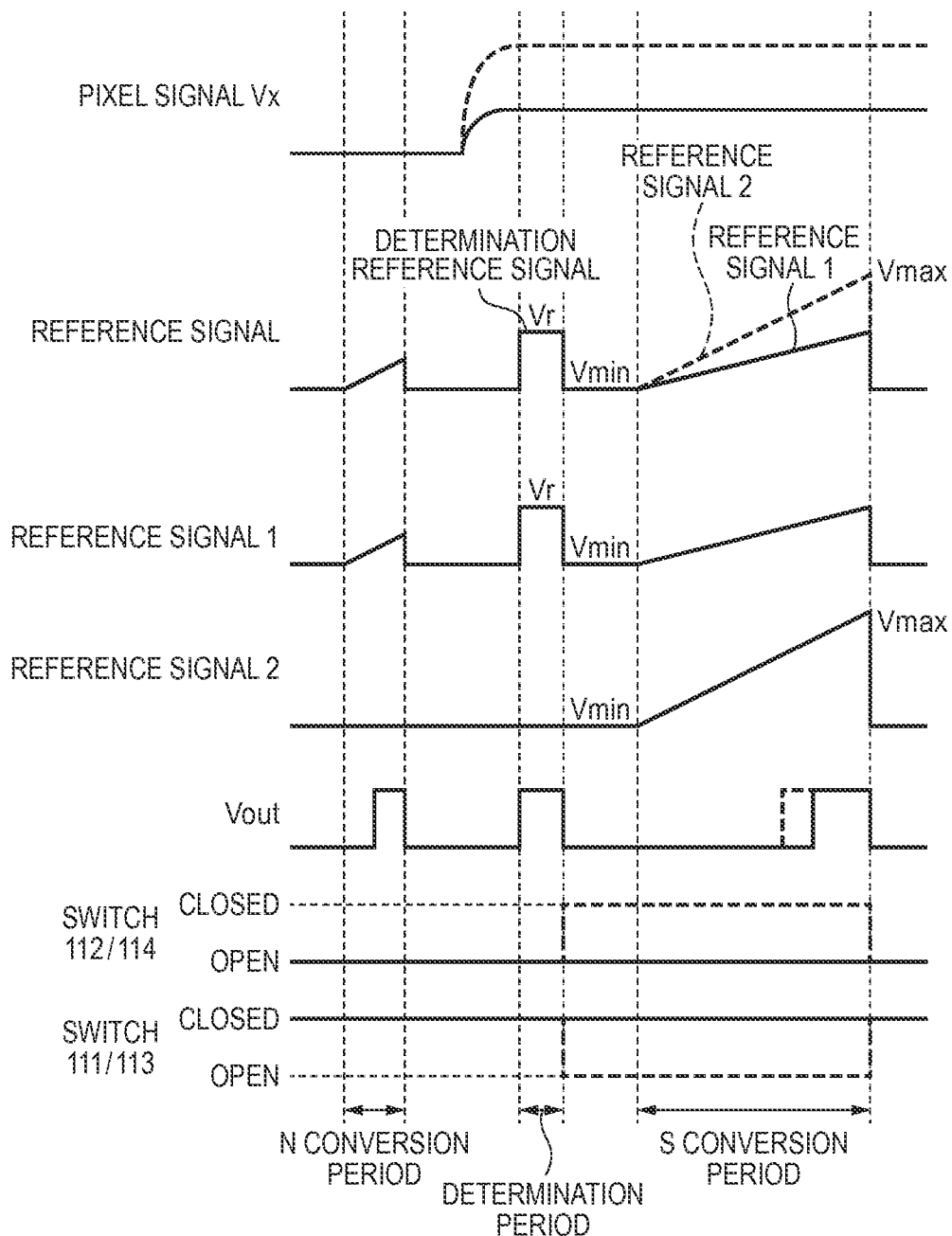
FIG. 5 is a timing chart for explaining the operation of the selection circuit according to the first embodiment.

The operation of the selection circuit 31 according to the first embodiment will be described with reference to a timing chart shown in FIG. 5.

To input reference signal 1 to the comparator 32, the selection circuit 31 closes the switch 111, and opens the switch 114, thereby selectively connecting the reference signal line 15-1 to the reference signal connection node 103. At the same time, the selection circuit 31 opens the switch 112, and close the switch 113, thereby selectively connecting the capacitance 102 to the reference signal line 15-2. At this time, the pixel outputs a reset signal. During a noise level conversion (N conversion) period, the comparator 32 compares the reset signal of the pixel with reference signal 1 with a ramp voltage. When reference signal 1 and the reset signal of the pixel become the same level, the output of the comparator 32 is inverted.

During a determination period after a pixel signal Vx is switched to a significant signal, reference signal 1 maintains a determination reference voltage Vr as a determination reference signal, and comparison processing is executed for each column. That is, during the determination period, the reference signal source 12 supplies a determination reference signal with the determination reference voltage Vr instead of the reference signal with a ramp voltage.

In a column in which the result of the processing of comparing the significant signal Vx of the pixel with the determination reference signal Vr indicates that the significant signal Vx is larger than the determination reference signal Vr (Vx>Vr), the switches 111 and 113 are opened, and the switches 112 and 114 are closed. As a result, the reference signal connection node 103 is selectively connected to the reference signal line 15-2, and the capacitance 102 is selectively connected to the reference signal line 15-1. In other words, reference signal 2 has been selected to be compared with the significant signal. In a column in which the comparison processing result indicates Vx≤Vr, the switches are not switched (the switches 111 and 113 remain the closed state, and the switches 112 and 114 remain the open state). In other words, reference signal 1 has been selected to be compared with the significant signal.

During a signal level conversion (S conversion) period, the comparator 32 compares the significant signal Vx of the pixel with reference signal 1 or 2 with a ramp voltage. When reference signal 1 or 2 and the significant signal Vx of the pixel become the same level, the output of the comparator 32 is inverted. Note that reference signals 1 and 2 have the same initial voltage level Vmin, and have different voltage ramp gradients.

Each count circuit 41 of the counter 40 counts a period from when the N conversion period or S conversion period starts until an output signal Vout of the comparator 32 of a corresponding column is inverted, and stores a count result in a corresponding memory circuit 51. The memory circuit 51 of a column in which reference signal 2 has been selected to be compared with the significant signal performs, for the count result, a bit shift proportional to the ratio between the gradients of reference signals 1 and 2.

As described above, reference signal 1 with a small gradient is used to perform high resolution A/D conversion when Vx≤Vr, and reference signal 2 with a large gradient is used to perform low resolution A/D conversion when Vx>Vr, thereby shortening a conversion time. At this time, the load of the reference signal line is almost constant regardless of whether the reference signal of the signal line is used for comparison processing, and load variations of the reference signal line depending on the pixel signal are suppressed, thereby enabling to prevent the accuracy of A/D conversion from decreasing.

Second Embodiment

A solid-state image sensing device and an A/D conversion method therefor according to the second embodiment of the present invention will be described below. Note that in the second embodiment, the same components as those in the first embodiment have the same reference numerals, and a detailed description thereof will be omitted.

Figure 6:
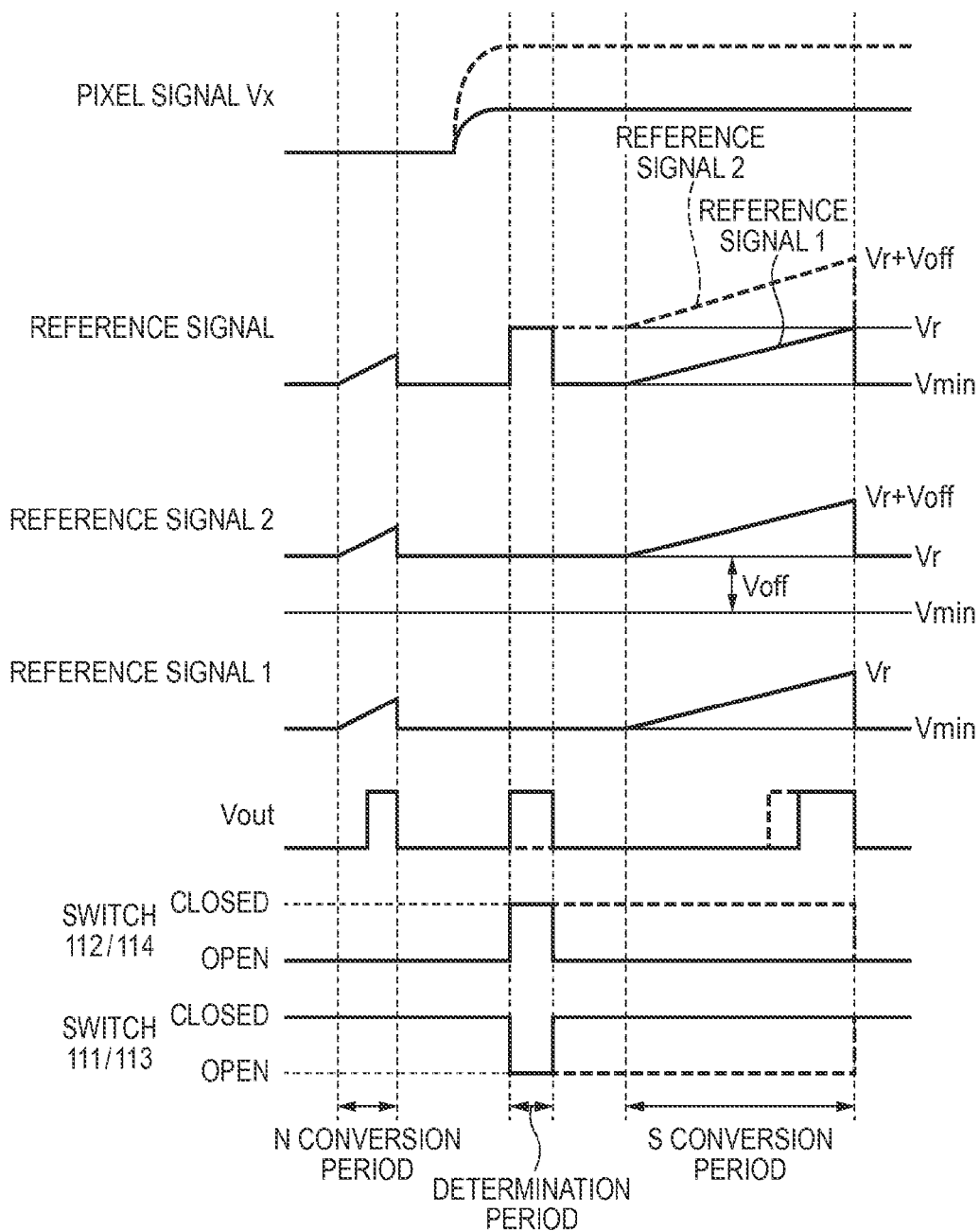
FIG. 6 is a timing chart for explaining the operation of a selection circuit according to the second embodiment.

The operation of a selection circuit 31 according to the second embodiment will be described with reference to a timing chart shown in FIG. 6.

To input reference signal 1 to a comparator 32, the selection circuit 31 closes a switch 111, and opens a switch 114, thereby selectively connecting a reference signal line 15-1 to a reference signal connection node 103. At the same time, the selection circuit 31 opens a switch 112, and closes a switch 113, thereby selectively connecting a capacitance 102 to a reference signal line 15-2. At this time, a pixel outputs a reset signal. During an N conversion period, the comparator 32 compares the reset signal of the pixel with reference signal 1 with a ramp voltage. When reference signal 1 and the reset signal of the pixel become the same level, the output of the comparator 32 is inverted.

During a determination period after a pixel signal Vx is switched to a significant signal, the selection circuit 31 opens the switch 111, and closes the switch 114, thereby selectively connecting the capacitance 102 to the reference signal line 15-1. At the same time, the selection circuit 31 closes the switch 112, and opens the switch 113, thereby selectively connecting the reference signal line 15-2 to the reference signal connection node 103. Reference signal 2 has an initial level Vr, and has been offset by Voff (=Vr−Vmin) with respect to reference signal 1. During the determination period, therefore, the comparator 32 compares the determination reference signal Vr with the significant signal Vx of the pixel.

In a column in which a comparison processing result indicates Vx>Vr, the switches are not switched (the switches 111 and 113 remain the open state, and the switches 112 and 114 remain the closed state). As a result, reference signal 2 has been selected to be compared with the significant signal. In a column in which the comparison processing result indicates Vx≤Vr, the switches 111 and 113 are closed, and the switches 112 and 114 are opened. As a result, the reference signal connection node 103 is selectively connected to the reference signal line 15-1, and the capacitance 102 is selectively connected to the reference signal line 15-2. In other words, reference signal 1 has been selected to be compared with the significant signal.

During an S conversion period, the comparator 32 compares the significant signal Vx of the pixel with reference signal 1 or 2 with a ramp voltage. When reference signal 1 or 2 and the significant signal Vx of the pixel become the same level, the output of the comparator 32 is inverted. Note that reference signal 1 has a voltage which ramps up from Vmin to Vr, and reference signal 2 has a voltage which ramps up from Vr to Vr+Voff. The reference signals have the same voltage ramp gradient.

Each count circuit 41 of a counter 40 counts a period from when the N conversion period or S conversion period starts until an output signal Vout of the comparator 32 of a corresponding column is inverted, and stores a count result in a corresponding memory circuit 51. The memory circuit 51 of a column in which reference signal 2 has been selected to be compared with the significant signal adds, to the count result, a count value for an offset Voff between reference signals 1 and 2.

As described above, by selecting, from the two reference signals which have been offset from each other, a reference signal to be compared with the significant signal according to the significant signal of the pixel, it is possible to shorten a conversion period as compared with a case in which one reference signal is used to perform A/D conversion. At this time, the load of the reference signal line is almost constant regardless of whether the reference signal of the signal line is used for comparison processing, and load variations of the reference signal line depending on the pixel signal are suppressed, thereby enabling to prevent the accuracy of A/D conversion from decreasing.

Third Embodiment

A solid-state image sensing device and an A/D conversion method therefor according to the third embodiment of the present invention will be described below. Note that in the third embodiment, the same components as those in the first and second embodiments have the same reference numerals, and a detailed description thereof will be omitted.

Figure 7:
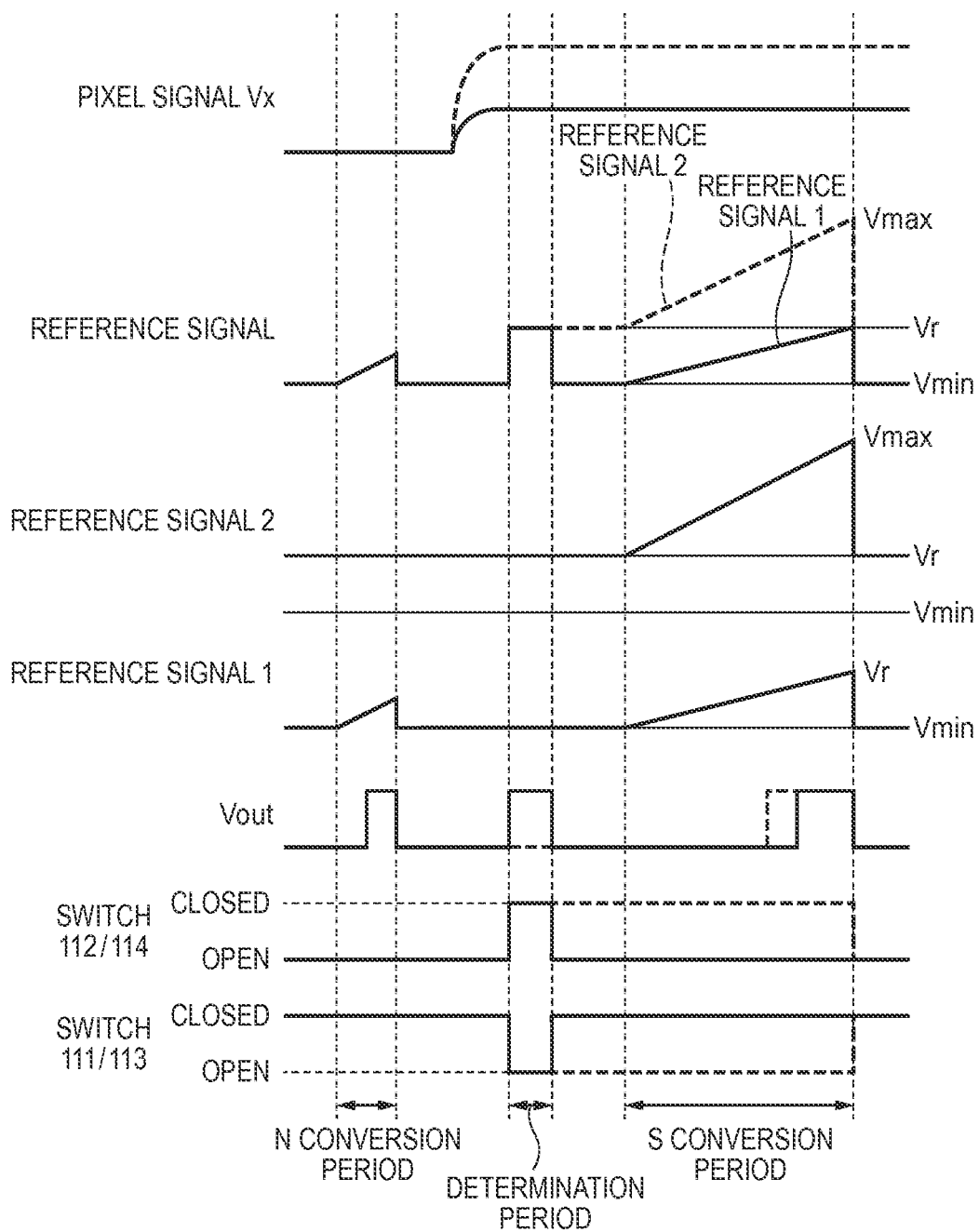
FIG. 7 is a timing chart for explaining the operation of a selection circuit according to the third embodiment.

The operation of a selection circuit 31 according to the third embodiment will be described with reference to a timing chart shown in FIG. 7.

To input reference signal 1 to a comparator 32, the selection circuit 31 closes a switch 111, and opens a switch 114, thereby selectively connecting a reference signal line 15-1 to a reference signal connection node 103. At the same time, the selection circuit 31 opens a switch 112, and closes a switch 113, thereby selectively connecting a capacitance 102 to a reference signal line 15-2. At this time, a pixel outputs a reset signal. During an N conversion period, the comparator 32 compares the reset signal of the pixel with reference signal 1 with a ramp voltage. When reference signal 1 and the reset signal of the pixel become the same level, the output of the comparator 32 is inverted.

During a determination period after a pixel signal Vx is switched to a significant signal, the selection circuit 31 opens the switch 111, and closes the switch 114, thereby selectively connecting the capacitance 102 to the reference signal line 15-1. At the same time, the selection circuit 31 closes the switch 112, and opens the switch 113, thereby selectively connecting the reference signal line 15-2 to the reference signal connection node 103. Reference signal 2 has an initial level Vr. During the determination period, therefore, the comparator 32 compares the determination reference signal Vr with the significant signal Vx of the pixel.

In a column in which a comparison processing result indicates Vx>Vr, the switches are not switched (the switches 111 and 113 remain the open state, and the switches 112 and 114 remain the closed state). In other words, reference signal 2 has been selected to be compared with the significant signal. In a column in which the comparison processing result indicates Vx≤Vr, the switches 111 and 113 are closed, and the switches 112 and 114 are opened. As a result, the reference signal connection node 103 is selectively connected to the reference signal line 15-1, and the capacitance 102 is selectively connected to the reference signal line 15-2. In other words, reference signal 1 has been selected to be compared with the significant signal.

During an S conversion period, the comparator 32 compares the significant signal Vx of the pixel with reference signal 1 or 2 with a ramp voltage. When reference signal 1 or 2 and the significant signal Vx of the pixel become the same level, the output of the comparator 32 is inverted. Note that reference signal 1 has a voltage which ramps up from Vmin to Vr, and reference signal 2 has a voltage which ramps up from Vr to Vmax. The reference signals have different voltage ramp gradients.

Each count circuit 41 of a counter 40 counts a period from when the N conversion period or S conversion period starts until an output signal Vout of the comparator 32 of a corresponding column is inverted, and stores a count result in a corresponding memory circuit 51. The memory circuit 51 of a column in which reference signal 2 has been selected to be compared with the significant signal performs, for the count result, a bit shift proportional to the ratio between the gradients of reference signals 1 and 2. The memory circuit 51 also adds, to the count value having undergone the bit shift, a count value for an offset Voff (=Vr−Vmin) between reference signals 1 and 2.

As described above, by selecting, from the two reference signals which have been offset from each other and have different voltage ramp gradients, a reference signal to be compared with the significant signal, it is possible to shorten a conversion period as compared with a case in which one reference signal is used to perform A/D conversion. At this time, the load of the reference signal line is almost constant regardless of whether the reference signal of the signal line is used for comparison processing, and load variations of the reference signal line depending on the pixel signal are suppressed, thereby enabling to prevent the accuracy of A/D conversion from decreasing.

Fourth Embodiment

A solid-state image sensing device and an A/D conversion method therefor according to the fourth embodiment of the present invention will be described below. Note that in the fourth embodiment, the same components as those in the first to third embodiments have the same reference numerals, and a detailed description thereof will be omitted.

Figure 8:
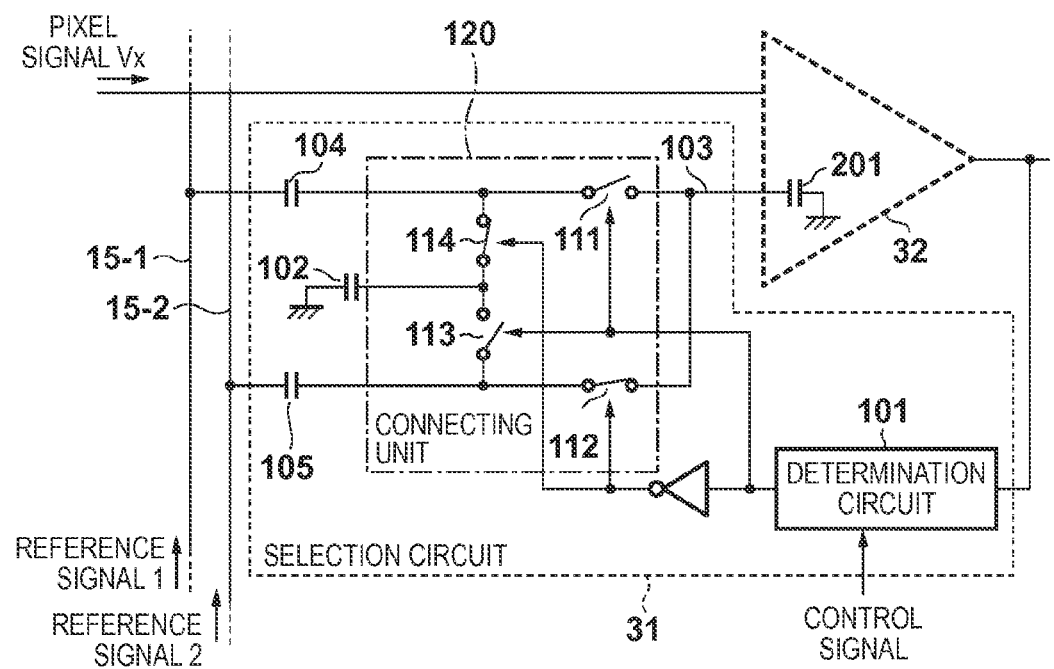
FIG. 8 is a circuit diagram showing the arrangement of a selection circuit according to the fourth embodiment.

The arrangement of a selection circuit 31 according to the fourth embodiment will be described with reference to a circuit diagram shown in FIG. 8. Unlike the arrangement of the first embodiment shown in FIG. 4, a capacitance 104 is connected between a reference signal line 15-1 and a switch 111, and a capacitance 105 is connected between a reference signal line 15-2 and a switch 112. Although not shown, components such as a switch for emitting charges accumulated in each capacitance during a period other than a conversion period or determination period are provided.

The reference signal source 12 of the third embodiment supplies a constant current as a reference signal. A voltage on the reference signal line changes steadily due to the supplied constant current and the load capacitance of the reference signal line. In other words, in the third embodiment, the gradient of the reference signal is determined based on a current value and the load capacitance of the reference signal line. The voltage of the reference signal connection node 103 is obtained by dividing the voltage on the reference signal line by the capacitance value of the capacitance 104 and that of the load capacitance 201, or by the capacitance value of the capacitance 105 and that of the load capacitance 201. If these capacitance values are equal to each other, the voltage of the reference signal connection node 103 is half the voltage on the reference signal line.

In the fourth embodiment, the operation except that the gradient and the voltage of the reference signal are determined based on the value of the constant current, the load capacitance, and the ratio between the capacitance values is the same as that in the first to third embodiments, and the same effects as those in the embodiments are obtained.

Fifth Embodiment

A solid-state image sensing device and an A/D conversion method therefor according to the fifth embodiment of the present invention will be described below. Note that in the fifth embodiment, the same components as those in the first to fourth embodiments have the same reference numerals, and a detailed description thereof will be omitted.

Figure 9:
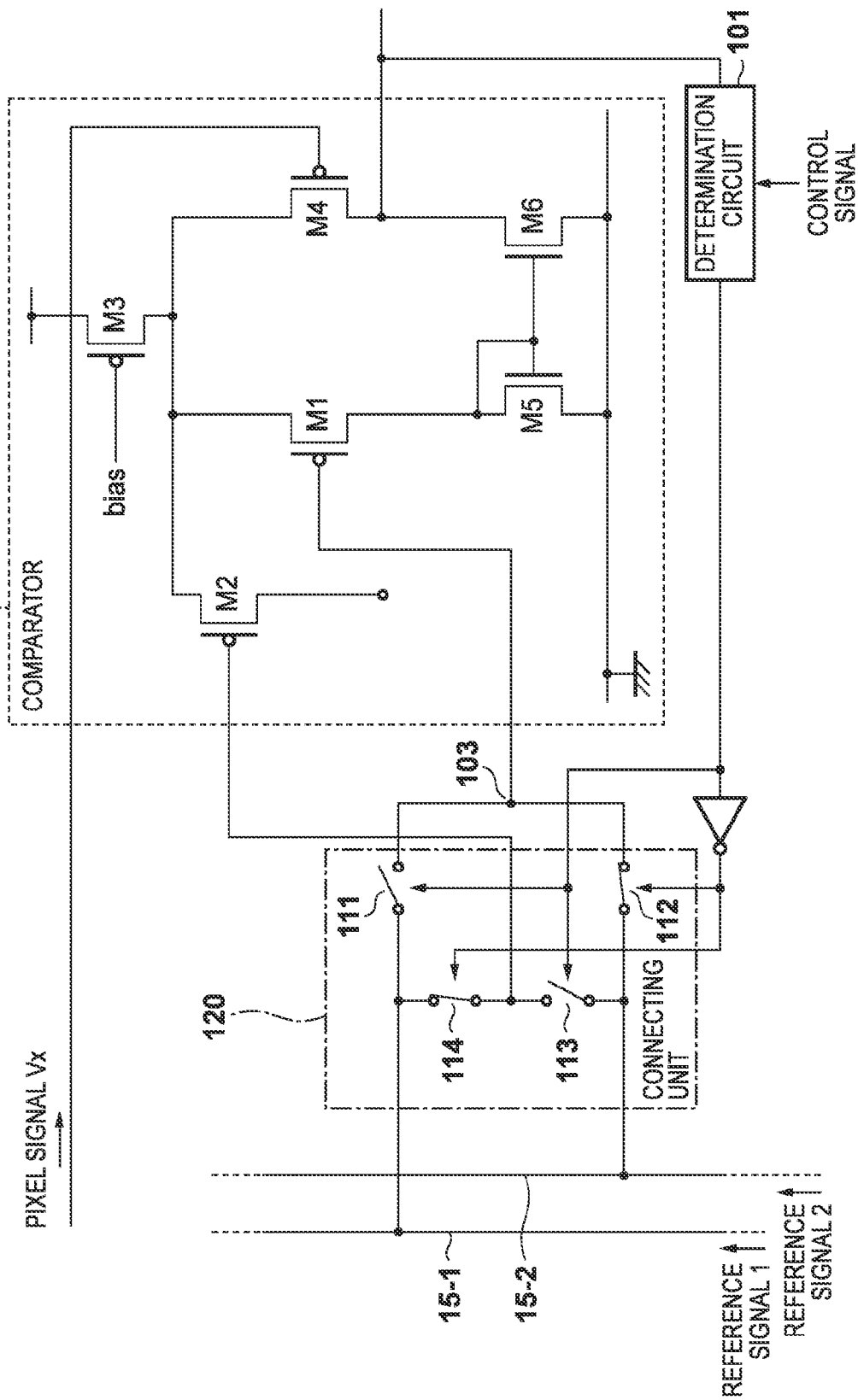
FIG. 9 is a circuit diagram showing the arrangement of a selection circuit according to the fifth embodiment.

The arrangement of a selection circuit 31 according to the fifth embodiment will be described with reference to a circuit diagram shown in FIG. 9. Note that in the fifth embodiment, part of the arrangement of the selection circuit 31 is included within a comparator 32.

An input transistor M1 of the comparator 32 has a gate terminal connected to a reference signal connection node 103, a source terminal connected to the drain terminal of a transistor M3, and a drain terminal connected to the drain terminal of a transistor M5.

An input transistor M2 has the characteristics equivalent to those of the transistor M1. The transistor M2 has a gate terminal connected to the connection unit of switches 113 and 114, a source terminal connected to the drain terminal of the transistor M3, and a floating drain terminal. The transistor M2 is, therefore, a dummy transistor which does not operate. Note that the transistors M1 and M2 have the same size (the same gate width and the same gate length) so as to present the equivalent characteristics.

A transistor M4 has a gate terminal to which a pixel signal Vx is input, a source terminal connected to the drain terminal of the transistor M3, and a drain terminal connected to the drain terminal of a transistor M6 and the input of a determination circuit 101 as the output of the comparator 32.

In the fifth embodiment, the load of the reference signal line of each column is one of the transistors M1 and M2 which have the equivalent characteristics, and the load is always constant, thereby suppressing load variations of the reference signal line depending on the pixel signal. That is, the transistor M2 functions as the capacitance 102 in the first to third embodiments, thus the determination circuit 101, the connecting unit 120 and the transistor M2 compose the selection circuit 31. The equivalent transistors M1 and M2 perform the same operation for voltage variations or load variations of a plurality of reference signal lines, as a matter of course.

In the fifth embodiment, the operation except that the dummy transistor M2 is used instead of the capacitance 102 is the same as that in the first to third embodiments, and the same effects as those in the embodiments are obtained.

Sixth Embodiment

A solid-state image sensing device and an A/D conversion method therefor according to the sixth embodiment of the present invention will be described below. Note that in the sixth embodiment, the same components as those in the first to fifth embodiments have the same reference numerals, and a detailed description thereof will be omitted.

Figure 10:
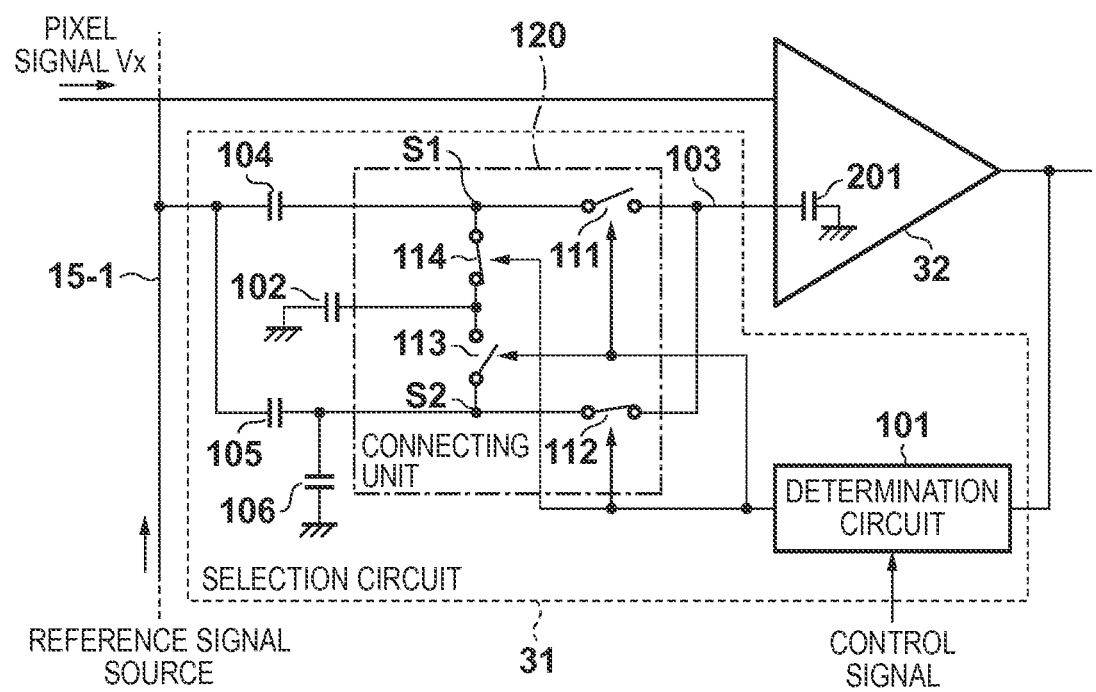
FIG. 10 is a circuit diagram showing the arrangement of a selection circuit according to the sixth embodiment.

The arrangement of a selection circuit 31 according to the sixth embodiment will be described with reference to a circuit diagram shown in FIG. 10. There are some points different from the arrangement in the fourth embodiment shown in FIG. 8. Firstly, there is one reference signal line. Secondly, a capacitance 106 is connected between a ground potential GND and the connection point of a switch 112 and a capacitance 105. Thirdly, a determination circuit 101 can control the open/closed states of switches 111 and 113 and switches 112 and 114 independently of each other.

Figure 11:
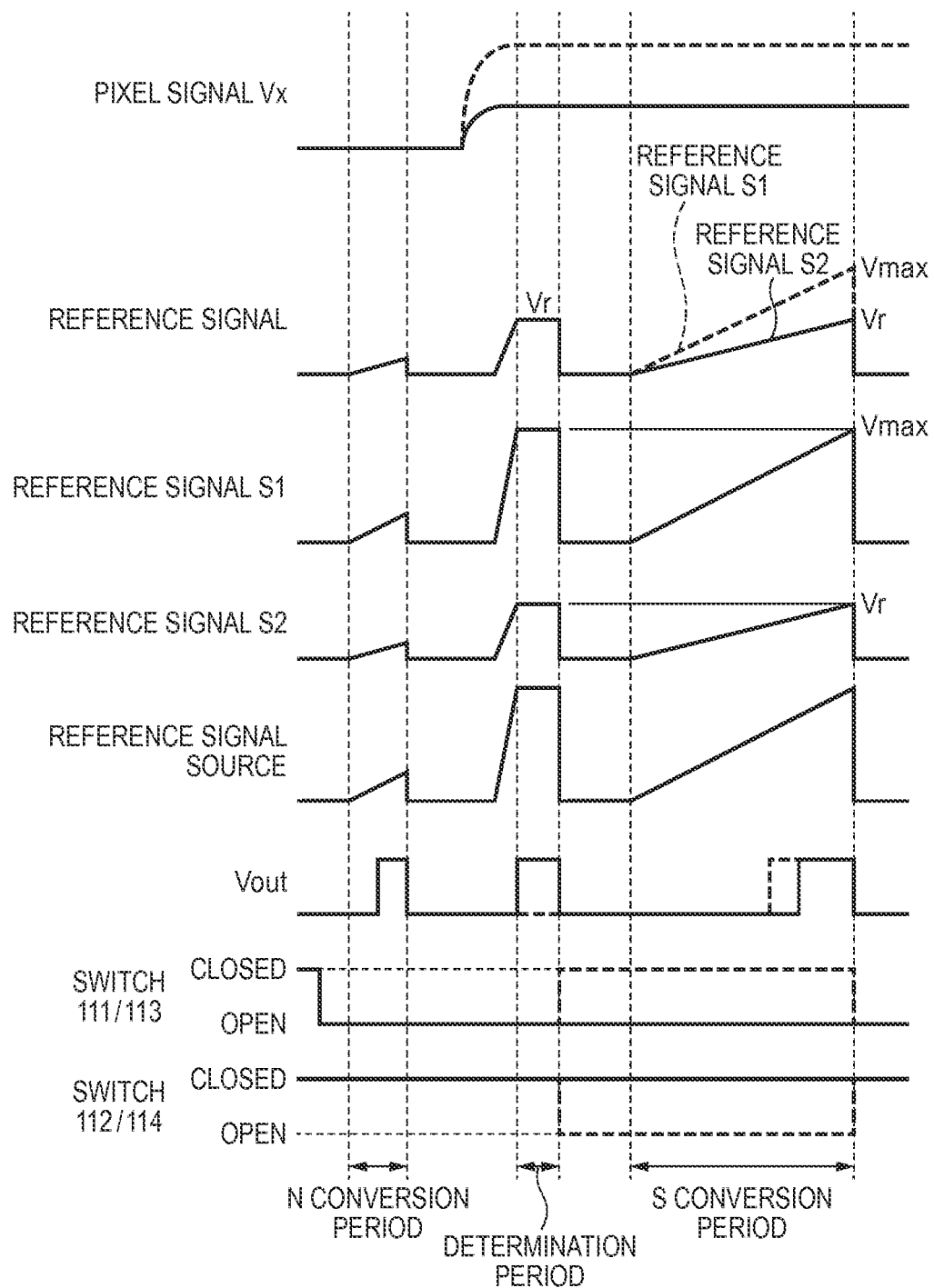
FIG. 11 is a timing chart for explaining the operation of the selection circuit according to the sixth embodiment.

The operation of the selection circuit 31 according to the sixth embodiment will be described with reference to a timing chart shown in FIG. 11.

The determination circuit 101 closes all the switches 111 to 114, and resets reference signals S1 and S2 to the same level. After that, the determination circuit 101 opens the switches 111 and 113 to selectively connect the reference signal S2 to a reference signal connection node 103. At this time, a pixel outputs a reset signal. During an N conversion period, the voltage of the reference signal S2 steadily changes due to charging from a reference signal line 15-1, and a comparator 32 compares the reset signal of the pixel with the reference signal S2.

Upon start of a determination period after a pixel signal Vx is switched to a significant signal, a reference signal source 12 increases the voltage of the reference signal S2 up to a determination reference signal Vr. In a column in which the result of the processing of comparing the significant signal Vx of the pixel with the determination reference signal Vr indicates Vx>Vr, the switches 111 and 113 are closed and the switches 112 and 114 are opened. As a result, the reference signal S1 is selectively connected to the reference signal connection node 103, and the reference signal S2 is selectively connected to a capacitance 102. In a column in which the comparison processing result indicates Vx≤Vr, the switches are not switched (the switches 111 and 113 remain the open state, and the switches 112 and 114 remain the closed state).

During an S conversion period, the comparator 32 compares the significant signal Vx of the pixel with the reference signal S1 or S2 with a ramp voltage. When the reference signal S1 or S2 and the significant signal Vx of the pixel become the same level, the output of the comparator 32 is inverted. Note that the reference signals S1 and S2 have the same initial voltage level, and different voltage ramp gradients.

Each count circuit 41 of a counter 40 counts a period from when the N conversion period or S conversion period starts until an output signal Vout of the comparator 32 of a corresponding column is inverted, and stores a count result in a corresponding memory circuit 51. The memory circuit 51 of a column in which reference signal 2 has been selected to be compared with the significant signal performs, for the count result, a bit shift proportional to the ratio between the gradient of reference signal 2 and that of reference signal 1. As described above, it is possible to obtain the same effects as those in the first embodiment.

Seventh Embodiment

A solid-state image sensing device and an A/D conversion method therefor according to the seventh embodiment of the present invention will be described below. Note that in the seventh embodiment, the same components as those in the first to sixth embodiments have the same reference numerals, and a detailed description thereof will be omitted.

Figure 12:
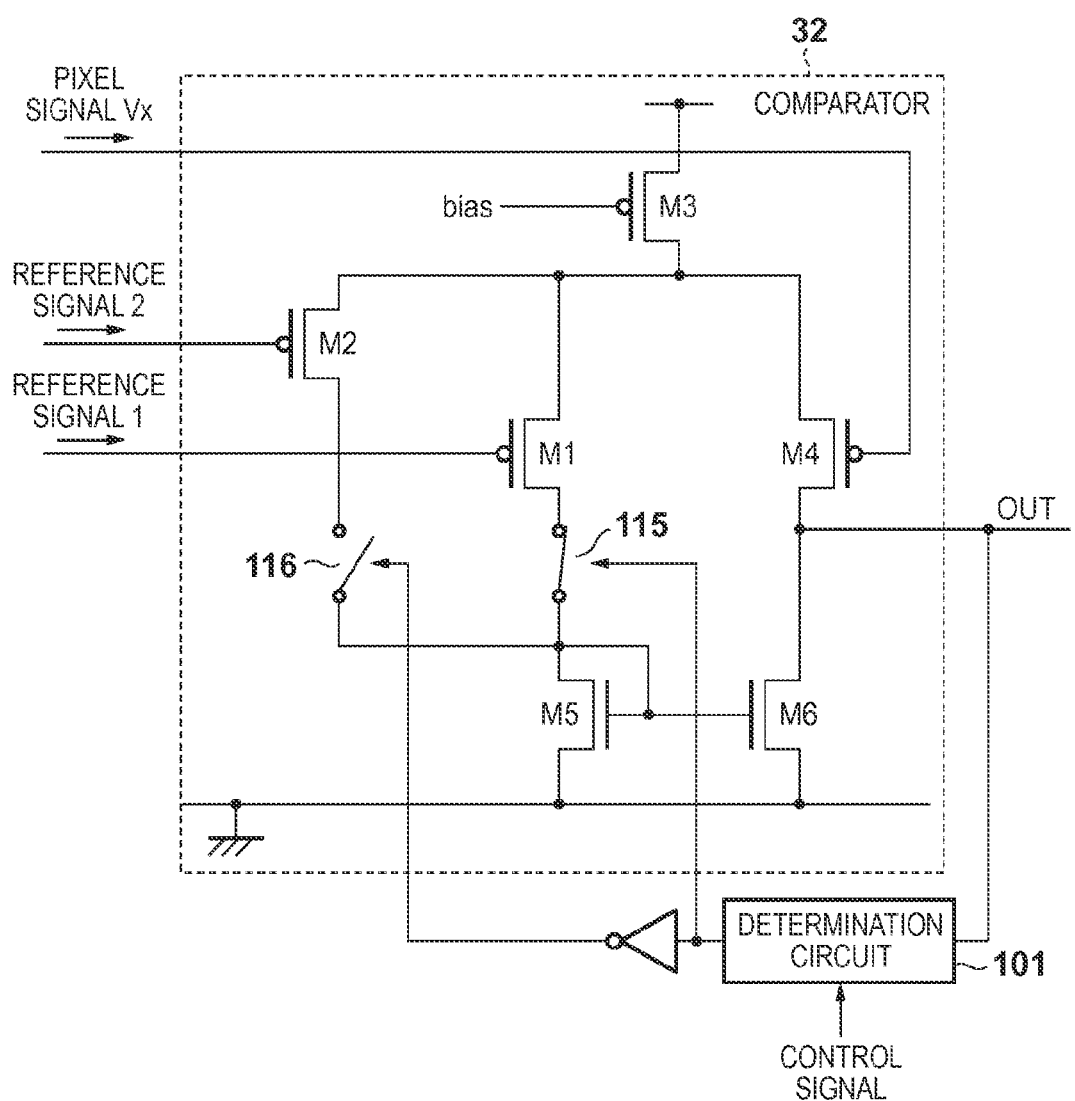
FIG. 12 is a circuit diagram showing the arrangement of a selection circuit according to the seventh embodiment.

The arrangement of a selection circuit 31 according to the seventh embodiment will be described with reference to a circuit diagram shown in FIG. 12. Note that in the seventh embodiment, part of the arrangement of the selection circuit 31 is included within a comparator 32.

An input transistor M1 of the comparator 32 has a gate terminal (first reference signal inputting unit) connected to a reference signal line 15-1, a source terminal connected to the drain terminal of a transistor M3, and a drain terminal connected to the drain terminal of a transistor M5 via a switch 115. An input transistor M2 has a gate terminal (second reference signal inputting unit) connected to a reference signal line 15-2, a source terminal connected to the drain terminal of the transistor M3, and a drain terminal connected to the drain terminal of the transistor M5 via a switch 116. The transistors M1 and M2 have the equivalent characteristics.

A transistor M4 has a gate terminal (pixel signal inputting unit) to which a pixel signal Vx is input, a source terminal connected to the drain terminal of the transistor M3, and a drain terminal connected to the drain terminal of a transistor M6 and the input of a determination circuit 101 as the output of the comparator 32.

Figure 13:
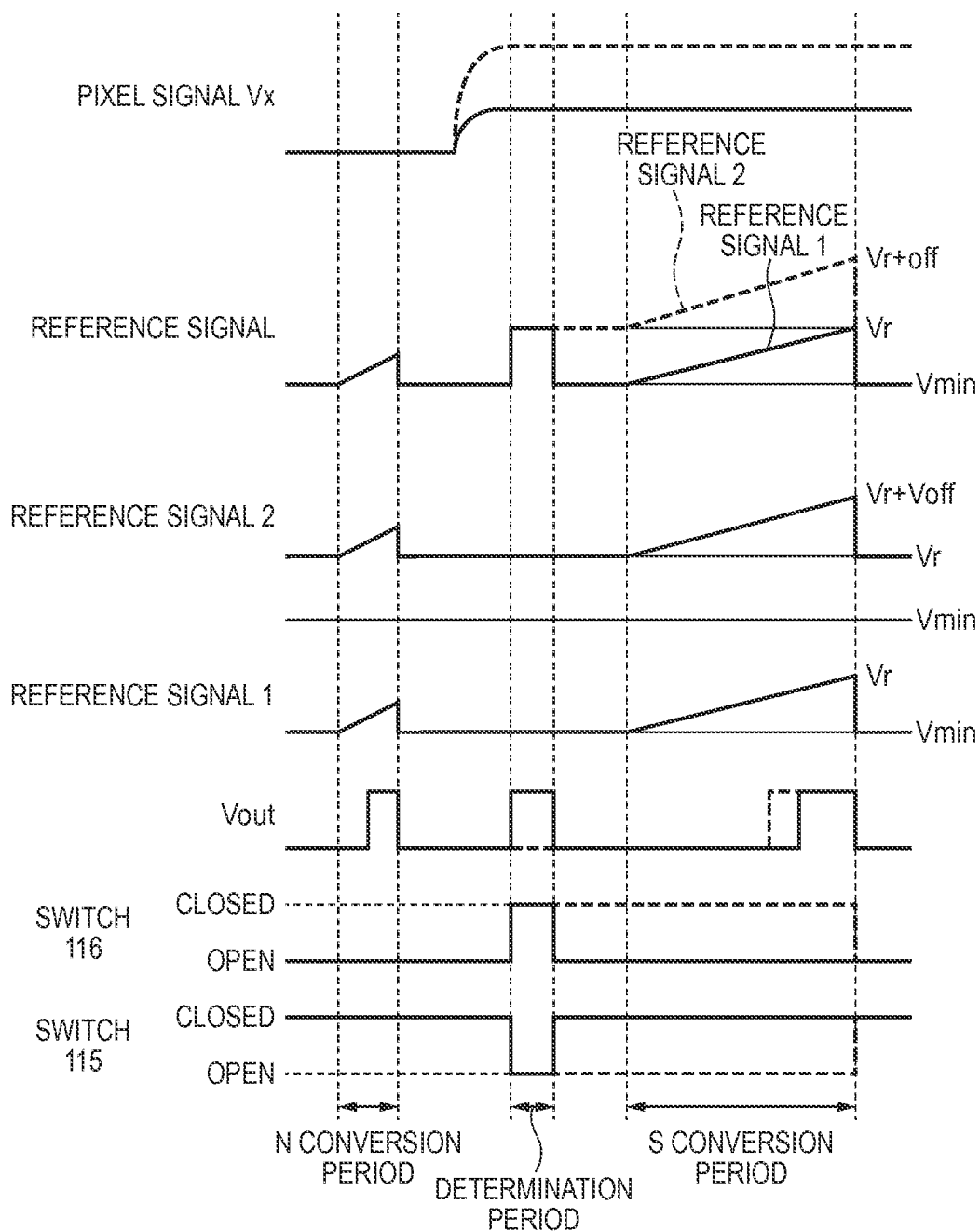
FIG. 13 is a timing chart for explaining the operation of the selection circuit according to the seventh embodiment.

The operation of the selection circuit 31 according to the seventh embodiment will be described with reference to a timing chart shown in FIG. 13.

The determination circuit 101 closes the switch 115, and opens the switch 116. The drain terminal of the transistor M1 is, therefore, connected to the drain terminal of the transistor M5, the transistors M1 and M4 form a differential pair, and the comparator 32 operates by receiving reference signal 1 as an input (the operation of the transistor M1 is valid). On the other hand, the drain terminal of the transistor M2 floats (the operation of the transistor M2 is invalid). At this time, a pixel outputs a reset signal. During an N conversion period, the voltage of reference signal 1 ramps up, and the comparator 32 compares the reset signal of the pixel with reference signal 1.

Upon start of a determination period after a pixel signal Vx is switched to a significant signal, the determination circuit 101 opens the switch 115, and closes the switch 116. The drain terminal of the transistor M2 is, therefore, connected to the drain terminal of the transistor M5, the transistors M2 and M4 form a differential pair, and the comparator 32 operates by receiving reference signal 2 as an input (the operation of the transistor M2 is valid). Reference signal 2 has an initial level Vr, and has been offset by Voff (=Vr−Vmin) with respect to reference signal 1. During the determination period, therefore, the comparator 32 compares the determination reference signal Vr with the significant signal Vx of the pixel.

In a column in which a comparison processing result indicates Vx>Vr, the switches are not switched (the switch 115 remains the open state, and the switch 116 remains the closed state). As a result, reference signal 2 has been selected to be compared with the significant signal. In a column in which the comparison processing result indicates Vx Vr, the switch 115 is closed, and the switch 116 is opened. As a result, reference signal 1 has been selected to be compared with the significant signal. That is, the determination circuit 101 and the switches 115 and 116 compose the selection circuit 31.

During an S conversion period, the comparator 32 compares the significant signal Vx of the pixel with reference signal 1 or 2 with a ramp voltage. When reference signal 1 or 2 and the significant signal Vx of the pixel become the same level, the output of the comparator 32 is inverted. Note that reference signal 1 has a voltage which ramps up from Vmin to Vr, and reference signal 2 has a voltage which ramps up from Vr to Vr+Voff. The reference signals have the same voltage ramp gradient.

Each count circuit 41 of a counter 40 counts a period from when the N conversion period or S conversion period starts until an output signal Vout of the comparator 32 of a corresponding column is inverted, and stores a count result in a corresponding memory circuit 51. The memory circuit 51 of a column in which reference signal 2 has been selected to be compared with the significant signal adds, to the count result, a count value for an offset Voff between reference signals 1 and 2.

As described above, it is possible to obtain the same effects as those in the second embodiment. The transistors M1 and M2 which always have the equivalent characteristics as the identical loads are connected to reference signal lines, respectively. The transistors M1 and M2 having the equivalent characteristics perform the same operation for voltage variations or load variations of a plurality of reference signal lines.

A case in which signals with different offsets are used as reference signals 1 and 2 to obtain the same effects as those in the second embodiment has been described. If signals having different gradients or signals having different gradients and different offsets are used, it is possible to obtain the same effects as those in the first or third embodiment, as a matter of course.

Eighth Embodiment

A solid-state image sensing device and an A/D conversion method therefor according to the eighth embodiment of the present invention will be described below. Note that in the eighth embodiment, the same components as those in the first to seventh embodiments have the same reference numerals, and a detailed description thereof will be omitted.

Figure 14:
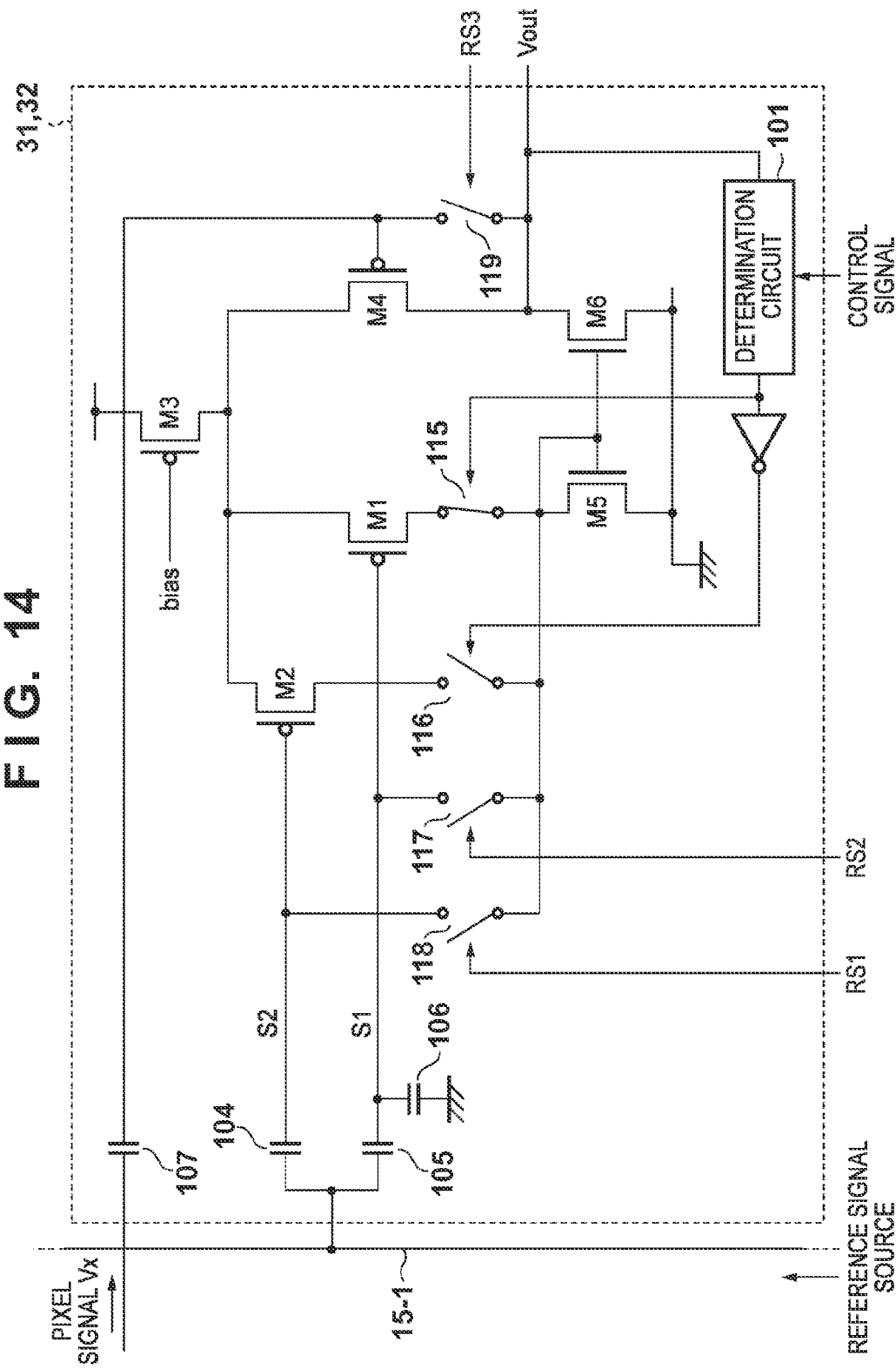
FIG. 14 is a circuit diagram showing the arrangement of a selection circuit and a comparator according to the eighth embodiment.

The arrangement of a selection circuit 31 and a comparator 32 according to the eighth embodiment will be described with reference to a circuit diagram shown in FIG. 14. In the eighth embodiment, part of the selection circuit 31 is included within the arrangement of the comparator 32. In the eighth embodiment, there is one reference signal line, and the connection destinations of the gates of transistors M1, M2, and M4 are different from those shown in FIG. 12 in the seventh embodiment.

The gate of the transistor M1 is connected to a reference signal line 15-1 via a capacitance 105, to a ground potential GND via a capacitance 106, and to the drain and gate of a transistor M5 via a switch 117. The gate of the transistor M2 is connected to the reference signal line 15-1 via a capacitance 104, and to the drain and gate of the transistor M5 via a switch 118. The transistors M1 and M2 have equivalent characteristics.

The gate of the transistor M4 receives a pixel signal Vx from an amplification circuit 21 via a capacitance 107, and is connected to the drain of a transistor M6 via a switch 119. Signals RS1, RS2, and RS3 output from a TG 13 control the open/closed states of the switches 117, 118, and 119, respectively.

Figure 15:
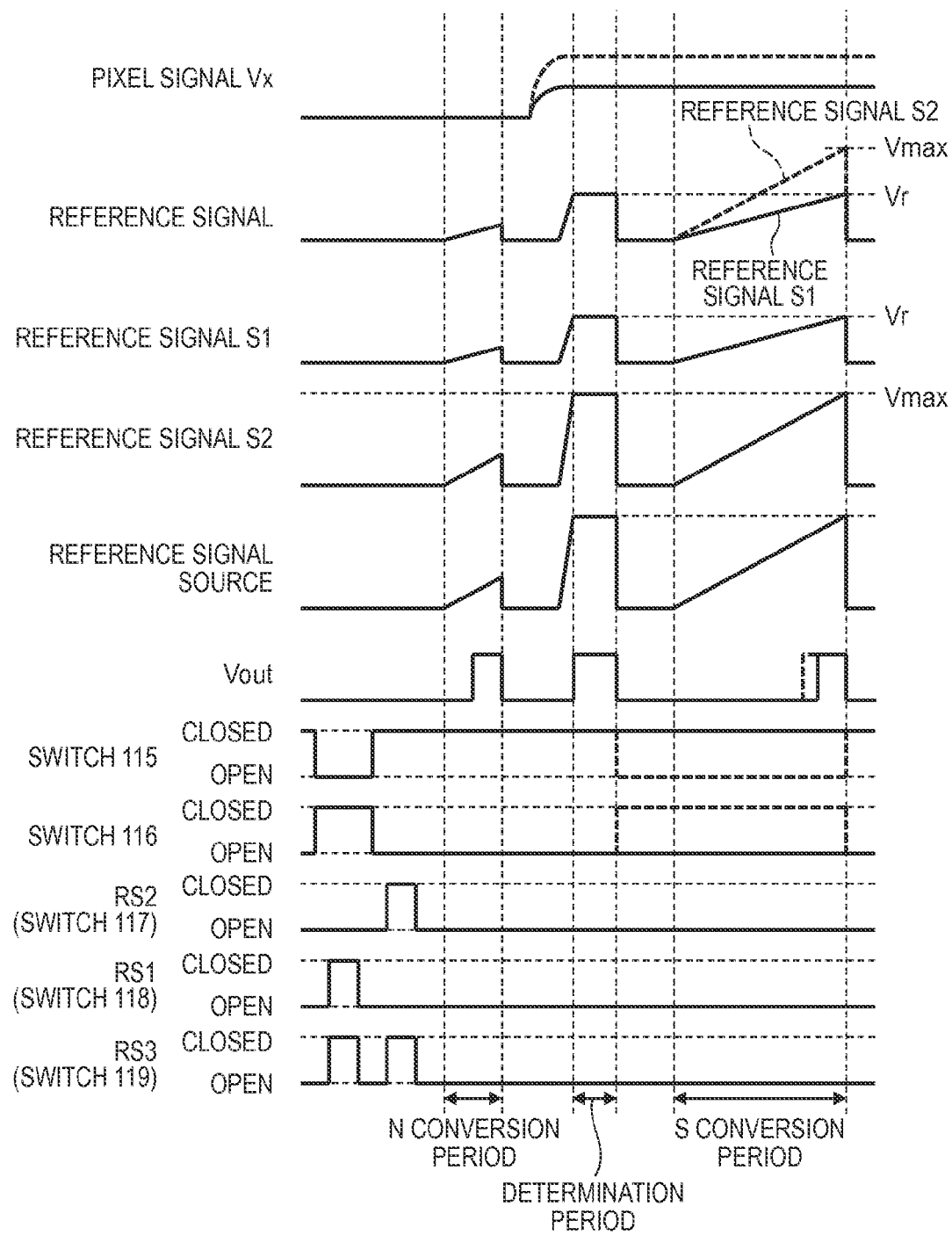
FIG. 15 is a timing chart for explaining the operation of the selection circuit and the comparator according to the eighth embodiment.

The operation of the selection circuit 31 and comparator 32 according to the eighth embodiment will be described with reference to a timing chart shown in FIG. 15.

Before an N conversion period, the following reset operation resets a reference signal S1 input to the gate of the transistor M1, and a reference signal S2 input to the gate of the transistor M2. Before the reset operation, a switch 115 is in a closed state, and switches 116 to 119 are in an open state. A determination circuit 101 sets the switch 116 in a closed state and sets the switch 115 in an open state. In this state, the TG 13 outputs the signals RS1 and RS3 to temporarily set the switches 118 and 119 in a closed state, respectively, and resets the reference signal S2 input to the gate of the transistor M2.

After that, the determination circuit 101 sets the switch 116 in an open state and sets the switch 115 in a closed state. In this state, the TG 13 outputs the signals RS2 and RS3 to temporarily set the switches 117 and 119 in a closed state, respectively, and resets the reference signal S1 input to the gate of the transistor M1. At this time, a pixel outputs a reset signal as a pixel signal Vx.

After the reset operation, N conversion, significant signal level determination, and S conversion are sequentially performed. In the N conversion period, the pixel is still in a state after outputting the reset signal as the pixel signal Vx, the switch 115 is in a closed state, and the switches 116 to 119 are in an open state. The voltage of the reference signal S1 steadily changes due to charging from the reference signal line 15-1, and the comparator 32 compares the reset signal of the pixel with the reference signal S1.

Until start of a determination period after the pixel signal Vx is switched to a significant signal, a reference signal source 12 increases the reference signal S1 up to a determination reference signal Vr. The open/closed state of each of the switches 115 and 116 is controlled for each column based on the processing of comparing the significant signal Vx of the pixel with the determination reference signal Vr. That is, in a column in which the comparison result during the determination period indicates Vx≤Vr, the switch 115 remains in the closed state and the switch 116 remains in the open state. On the other hand, in a column in which the comparison result during the determination period indicates Vx>Vr, the switch 115 is set in an open state and the switch 116 is set in a closed state.

In an S conversion period, the comparator 32 compares the significant signal Vx of the pixel with the reference signal S1 or S2 with a ramp voltage. In a column in which the comparison result indicates Vx Vr, the switch 115 is in a closed state and the switch 116 is in an open state, thereby comparing the significant signal Vx of the pixel with the reference signal S1. On the other hand, in a column in which the comparison result indicates Vx>Vr, the switch 115 is in an open state and the switch 116 is in a closed state, thereby comparing the significant signal Vx of the pixel with the reference signal S2. When the reference signal S1 or S2 and the significant signal Vx of the pixel become the same level, the output of the comparator 32 is inverted.

If, for example, each of the capacitances 104, 105, and 106 has the same capacitance value Cx as that of a load capacitance 201, the division ratio of the reference signal S1 is Cx/3Cx=1/3, and that of the reference signal S2 is Cx/2Cx=1/2. It is, therefore, possible to obtain, as the reference signals S1 and S2, reference signals having the same initial voltage level and different voltage ramp gradients. The voltage gradient of the reference signal S1 is smaller than that of the reference signal S2.

At this time, regardless of the pixel signal level of each column, the load of the reference signal line 15-1 hardly varies. As a result, it is possible to obtain the same effects as those in the sixth embodiment.

Ninth Embodiment

A solid-state image sensing device and an A/D conversion method therefor according to the ninth embodiment of the present invention will be described below. Note that in the ninth embodiment, the same components as those in the first to eighth embodiments have the same reference numerals, and a detailed description thereof will be omitted.

Figure 16:
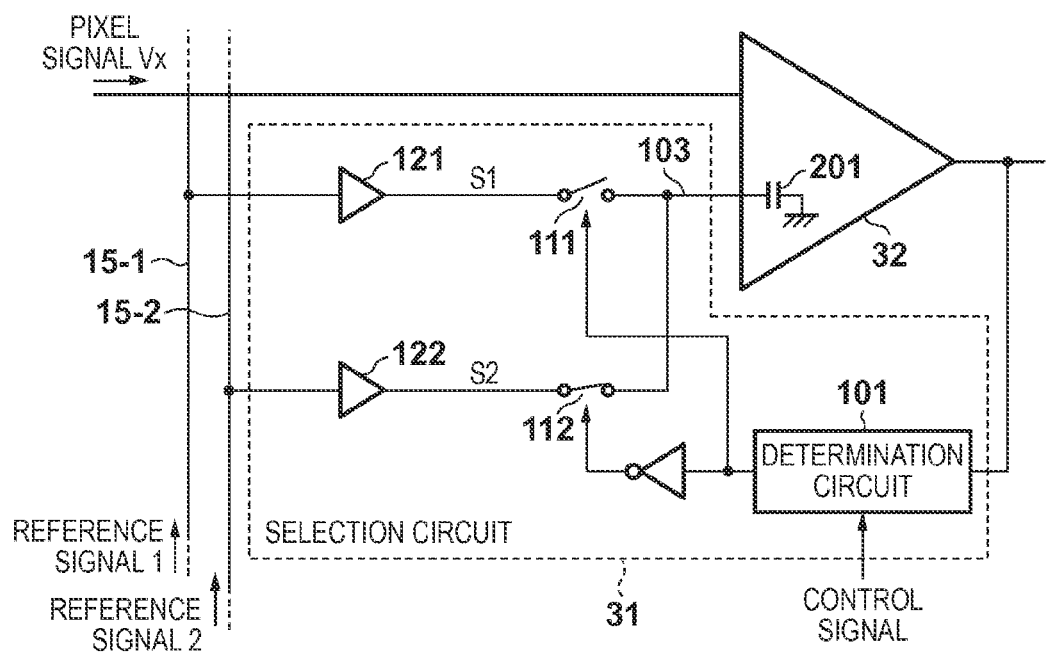
FIG. 16 is a circuit diagram showing the arrangement of a selection circuit according to the ninth embodiment.

The arrangement of a selection circuit 31 according to the ninth embodiment will be described with reference to a circuit diagram shown in FIG. 16. Different points from the first to third embodiments will be explained below. The arrangement of the ninth embodiment is different from that of the first to third embodiments, in that a buffer circuit (to be simply referred to as a buffer hereinafter) is arranged between a reference signal line 15-1 or 15-2 and a switch 111 or 112.

A buffer 121 has an input connected to the reference signal line 15-1 and an output connected to a reference signal connection node 103 (the input of a comparator 32) via the switch 111, and buffers a reference signal S1 supplied from the reference signal line 15-1. A buffer 122 has an input connected to the reference signal line 15-2 and an output connected to the reference signal connection node 103 via the switch 112, and buffers a reference signal S2 supplied from the reference signal line 15-2.

In this way, the selection circuit 31 supplies the reference signal S1 or S2 supplied from the reference signal line 15-1 or 15-2 to the input of the comparator 32 via the buffer 121 or 122. The operations of other components are the same as those in the first to third embodiments.

A capacitance including input capacitances existing in the inputs of the buffers 121 and 122 and a stray capacitance is almost constant regardless of the connection destinations of the outputs of the buffers 121 and 122. The load of the reference signal line 15-1 or 15-2, therefore, does not vary regardless of the pixel signal level of each column. As a result, it is possible to obtain the same effects as those in the first to third embodiments.

Furthermore, since the buffer 121 or 122 is inserted between the comparator 32 and the reference signal line 15-1 or 15-2, the influence on the output of a reference signal source 12 when the comparator 32 outputs a determination result Vout is suppressed, thereby preventing the accuracy of A/D conversion from decreasing.

The buffer 121 need only be operated at least while the comparator 32 compares a pixel signal Vx with the reference signal S1. Similarly, the buffer 122 need only be operated at least while the comparator 32 compares the pixel signal Vx with the reference signal S2. If the buffers 121 and 122 are simultaneously operated, since a capacitive load is not connected to the buffer whose output is not connected to the input of the comparator, the driving current of the buffer is smaller than that of the buffer whose output is connected to the input of the comparator 32.

Tenth Embodiment

A solid-state image sensing device and an A/D conversion method therefor according to the 10th embodiment of the present invention will be described below. Note that in the 10th embodiment, the same components as those in the first to ninth embodiments have the same reference numerals, and a detailed description thereof will be omitted.

Figure 17:
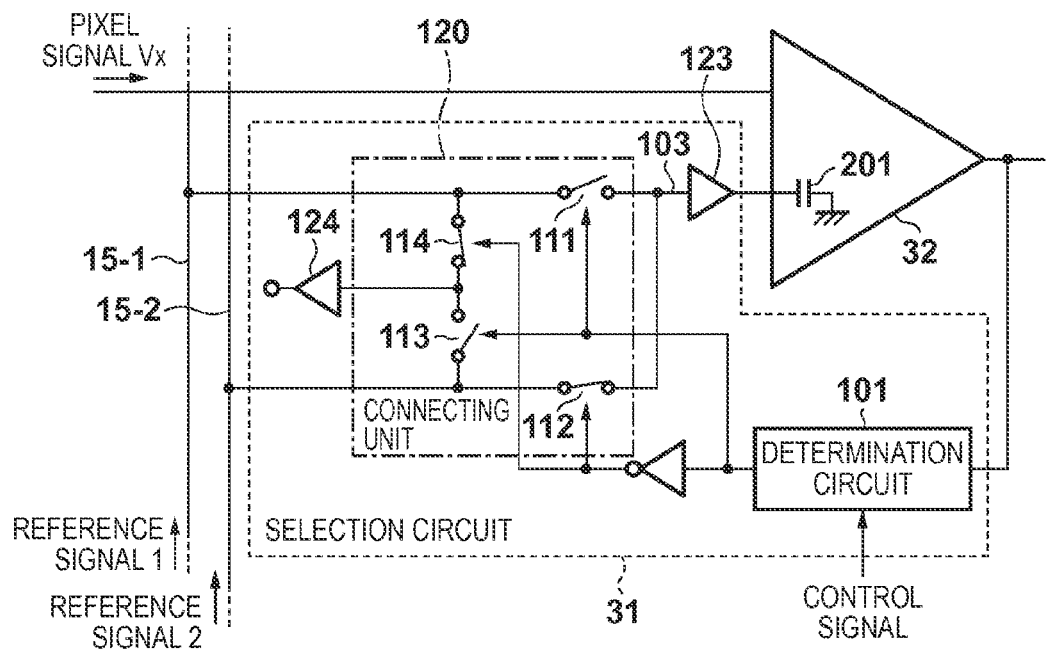
FIG. 17 is a circuit diagram showing the arrangement of a selection circuit according to the tenth embodiment.

The arrangement of a selection circuit 31 according to the 10th embodiment will be described with reference to a circuit diagram shown in FIG. 17. Different points from the first to third embodiments will be explained below. The arrangement of the 10th embodiment is different from that of the first to third embodiments, in that a buffer 123 is arranged between a reference signal connection node 103 and the input of a comparator 32 and a buffer 124 is arranged instead of the capacitance 102.

The buffer 123 has an input connected to the reference signal connection node 103 and an output connected to the input of the comparator 32, and buffers the signal of the reference signal connection node 103. The buffer 124 is a dummy circuit whose input is connected to the connection point of switches 113 and 114 and whose output is not connected anywhere. The buffers 123 and 124 have equivalent or almost equivalent input characteristics. The operations of other components are the same as those in the first to third embodiments.

A capacitance including input capacitances existing in the inputs of the buffers 123 and 124 and a stray capacitance is almost constant regardless of the connection destinations of the outputs of the buffers 123 and 124. The load of a reference signal line 15-1 or 15-2, therefore, hardly varies regardless of the pixel signal level of each column. As a result, it is possible to obtain the same effects as those in the first to third embodiments.

Furthermore, since no capacitive load is connected to the buffer 124, the driving current of the buffer 124 is smaller than that of the buffer 123.

Eleventh Embodiment

A solid-state image sensing device and an A/D conversion method therefor according to the 11th embodiment of the present invention will be described below. Note that in the 11th embodiment, the same components as those in the first to 10th embodiments have the same reference numerals, and a detailed description thereof will be omitted.

Figure 18:
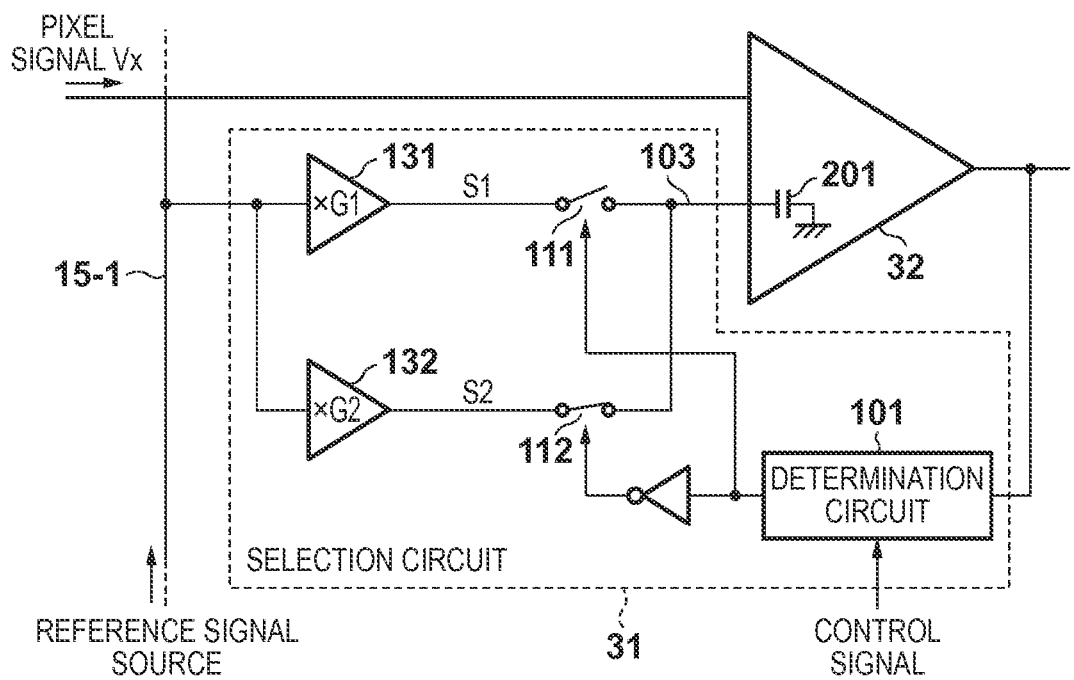
FIG. 18 is a circuit diagram showing the arrangement of a selection circuit according to the eleventh embodiment.

The arrangement of a selection circuit 31 according to the 11th embodiment will be described with reference to a circuit diagram shown in FIG. 18. The arrangement between a reference signal line 15-1 and a switch 111 or 112 in the 11th embodiment is different from that shown in FIG. 10 in the sixth embodiment.

An amplifier 131 has an input connected to the reference signal line 15-1 and an output connected to a reference signal connection node 103 via the switch 111, and amplifies, with a gain G1, the output signal of a reference signal source 12 input via the reference signal line 15-1. On the other hand, an amplifier 132 has an input connected to the reference signal line 15-1 and an output connected to the reference signal connection node 103 via the switch 112, and amplifies, with a gain G2, the output signal of the reference signal source 12 input via the reference signal line 15-1. The operations of other components are the same as those in the sixth embodiment.

Note that the gain G1 is set to 1, and the gain G2 is set to $\frac{1}{2^n}$ (n is a positive integer). That is, the amplifier 131 functions as a buffer to output a reference signal S1 having the same level as that of the output signal of the reference signal source 12. On the other hand, the amplifier 132 functions as an attenuator to output a reference signal S2 having a level obtained by attenuating the level of the output signal of the reference signal source 12 by $\frac{1}{2^n}$. As a result, when the level of the reference signal S2 becomes $\frac{1}{2^n}$ the level of the reference signal S1, and the reference signal source 12 outputs a signal with a ramp voltage, it is possible to obtain, as the reference signals S1 and S2, ramp signals having different voltage gradients, as shown in FIG. 11.

A capacitance including input capacitances existing in the inputs of the amplifiers 131 and 132 and a stray capacitance is almost constant regardless of the connection destinations of the outputs of the amplifiers 131 and 132. The load of the reference signal line 15-1, therefore, hardly varies regardless of the pixel signal level of each column. As a result, it is possible to obtain the same effects as those in the sixth embodiment.

Furthermore, since the amplifier 131 or 132 is arranged between the reference signal line 15-1 and the input of a comparator 32, the influence on the output of the reference signal source 12 when the comparator 32 outputs a determination result Vout is suppressed, thereby preventing the accuracy of A/D conversion from decreasing.

Although the gain G1 is set to 1 and the gain G2 is set to $\frac{1}{2^n}$ in the above-described example, the gains are not limited to them. For example, the gain G1 may be set to 2″ and the gain G2 may be set to 1. The amplifier 131 may then output the reference signal S1 having a level obtained by increasing the level of the output signal of the reference signal source 12 by a factor of 2″, and the amplifier 132 may output the reference signal S2 having the same level as that of the output signal of the reference signal source 12.

Twelfth Embodiment

A solid-state image sensing device and an A/D conversion method therefor according to the 12th embodiment of the present invention will be described below. Note that in the 12th embodiment, the same components as those in the first to 11th embodiments have the same reference numerals, and a detailed description thereof will be omitted.

Figure 19:
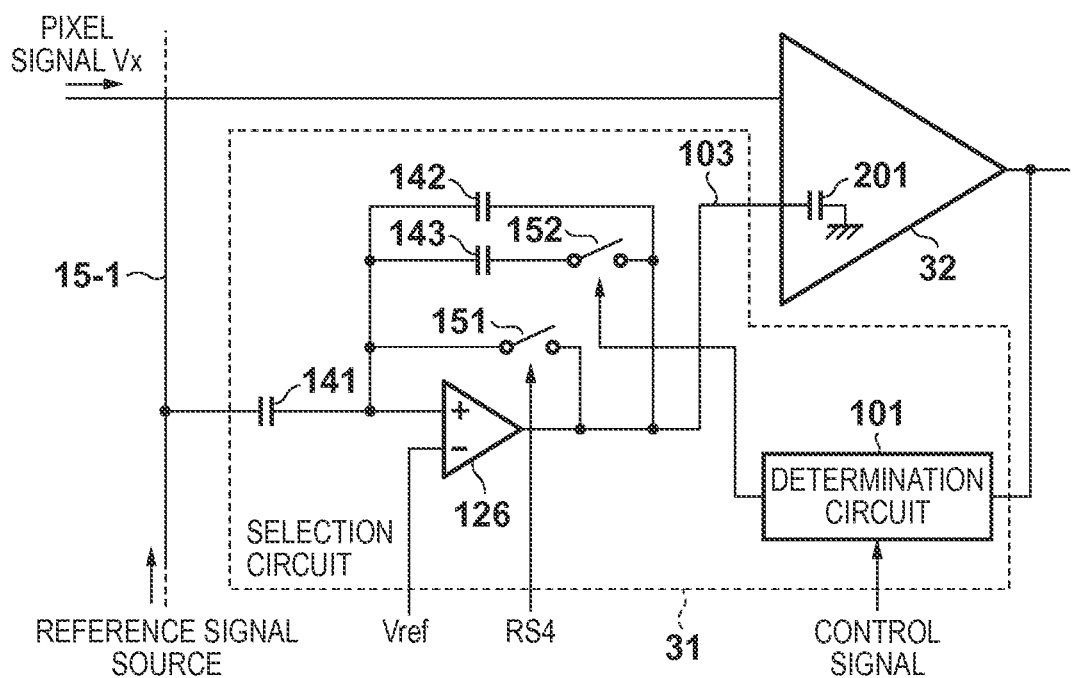
FIG. 19 is a circuit diagram showing the arrangement of a selection circuit according to the twelfth embodiment.

The arrangement of a selection circuit 31 according to the 12th embodiment will be described with reference to a circuit diagram shown in FIG. 19.

An amplifier 126 has a non-inverting input terminal (to be referred to as a positive terminal hereinafter) connected to a reference signal line 15-1 via a capacitance 141, an inverting input terminal (to be referred to as a negative terminal hereinafter) connected to a reference voltage Vref, and an output terminal connected to a reference signal connection node 103. A switch 151, a capacitance 142, and a series circuit of a capacitance 143 and switch 152 are connected in parallel between the positive terminal and output terminal of the amplifier 126.

Note that the connection order of the capacitance 143 and switch 152 is not limited to this. The capacitance 143 may be connected to the positive terminal as shown in FIG. 19, or the switch 152 may be connected to the positive terminal. Furthermore, a signal RS4 output from a TG 13 controls the open/closed state of the switch 151, and a determination circuit 101 controls the open/closed state of the switch 152.

Figure 20:
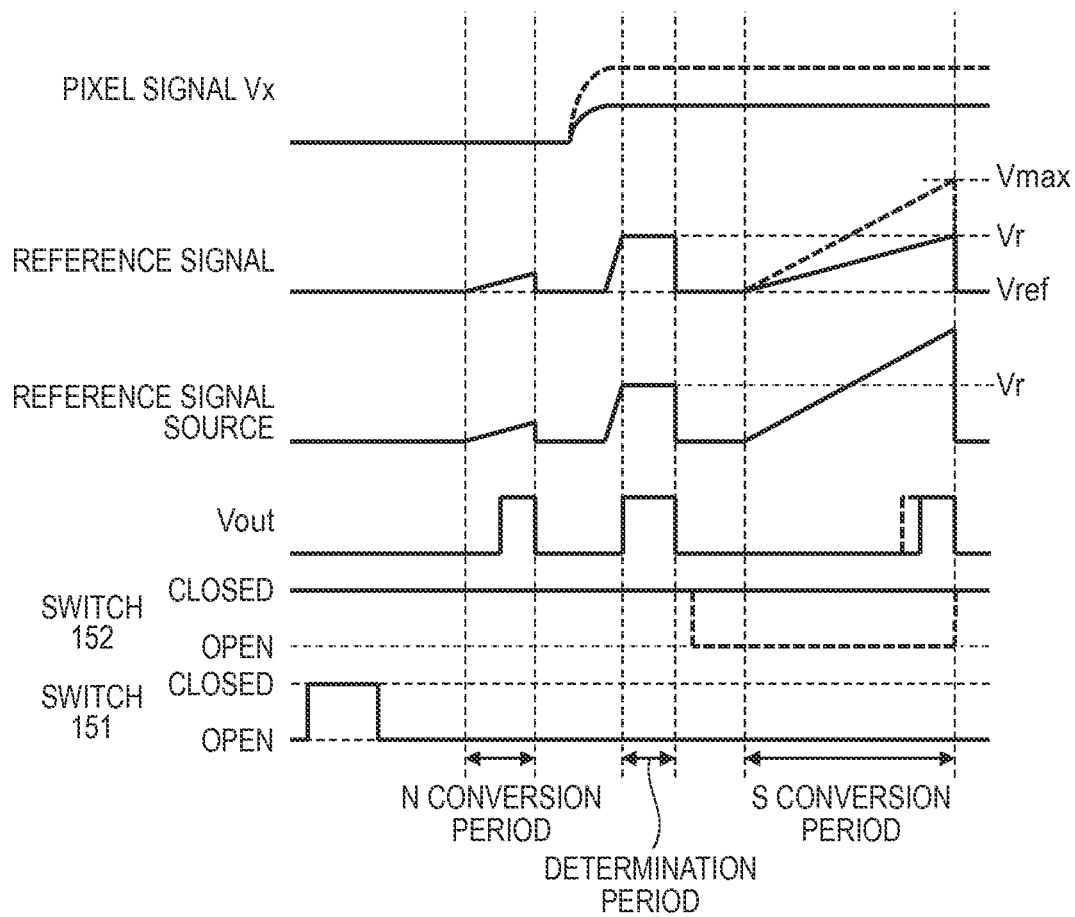
FIG. 20 is a timing chart for explaining the operation of a selection circuit according to the twelfth embodiment.

The operation of the selection circuit 31 according to the 12th embodiment will be described with reference to a timing chart shown in FIG. 20.

Before an N conversion period, the switch 152 is in a closed state and the switch 151 is in an open state. In this state, the TG 13 outputs the signal RS4 to temporarily set the switch 151 in a closed state, and resets the output voltage (reference signal) of the amplifier 126 to the reference voltage Vref.

After the reset operation, N conversion, significant signal level determination, and S conversion are sequentially performed. In the N conversion period, a pixel outputs a reset signal as a pixel signal Vx, and the switch 152 is in a closed state. The voltage of the reference signal steadily changes due to charging from the reference signal line 15-1, and a comparator 32 compares the reset signal of the pixel with the reference signal. For example, let Cx be the capacitance value of the capacitance 141, 142, or 143. Then, the amplifier 126 outputs, as a reference signal, a voltage obtained by multiplying a charging voltage V141 of the capacitance 141 by a gain Cx/2Cx=½ and adding the reference voltage Vref to the multiplication result.

Until start of a determination period after the pixel signal Vx is switched to a significant signal, a reference signal source 12 increases the reference signal up to a determination reference signal Vr. The open/closed state of the switch 152 is controlled for each column based on the processing of comparing the significant signal Vx of the pixel with the determination reference signal Vr. That is, in a column in which the comparison result during the determination period indicates Vx≤Vr, the switch 152 remains in the closed state. On the other hand, in a column in which the comparison result during the determination period indicates Vx>Vr, the switch 152 is set in an open state.

In an S conversion period, the comparator 32 compares the significant signal Vx of the pixel with the reference signal with a ramp voltage. In a column in which the comparison result indicates Vx≤Vr, the switch 152 is in a closed state, thereby comparing the pixel signal Vx with a reference signal obtained by multiplying the charging voltage V141 of the capacitance 141 by a gain ½ and adding the reference voltage Vref to the multiplication result. On the other hand, in a column in which the comparison result indicates Vx>Vr, the switch 152 is in an open state, thereby comparing the pixel signal Vx with a reference signal obtained by multiplying the charging voltage V141 of the capacitance 141 by a gain Cx/Cx=1 and adding the reference voltage Vref to the multiplication result. When the reference signal and the significant signal Vx of the pixel become the same level, the output of the comparator 32 is inverted.

That is, if the capacitances 141, 142, and 143 have the same capacitance value Cx, the gain is equal to 1 or ½, thereby obtaining reference signals having the same initial voltage level and different voltage ramp gradients. Note that as long as it is possible to obtain appropriate ramp signals as reference signals, the capacitances 141, 142, and 143 need not have the same capacitance value. If the capacitances 141, 142, and 143 have capacitance values C1, C2, and C3, respectively, the gain is C1/(C2+C3) when the switch 152 is in a closed state, and is C1/C2 when the switch 152 is in an open state.

The capacitance 141 is arranged in parallel with the reference signal line 15-1, thus the charging current of charging the capacitance 141 is common to each column. Regardless of the pixel signal level of each column, therefore, the load of the reference signal line 15-1 does not vary. As a result, it is possible to obtain the same effects as those in the sixth embodiment.

Thirteenth Embodiment

A solid-state image sensing device and an A/D conversion method therefor according to the 13th embodiment of the present invention will be described below. Note that in the 13th embodiment, the same components as those in the first to 12th embodiments have the same reference numerals, and a detailed description thereof will be omitted.

Figure 21:
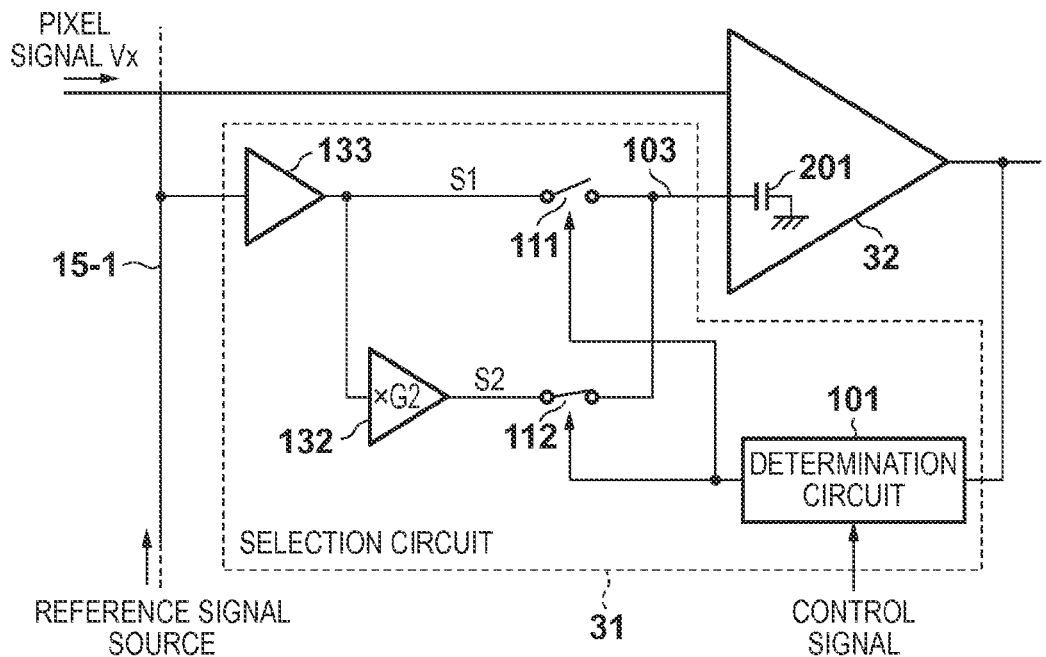
FIG. 21 is a circuit diagram showing the arrangement of a selection circuit according to the thirteenth embodiment.

The arrangement of a selection circuit 31 according to the 13th embodiment will be described with reference to a circuit diagram shown in FIG. 21. The arrangement between a reference signal line 15-1 and a switch 111 or 112 in the 13th embodiment is different from that shown in FIG. 18 in the 11th embodiment.

A buffer 133 has an input connected to the reference signal line 15-1, and an output connected to a reference signal connection node 103 via the switch 111 and connected to the input of an amplifier 132. The buffer 133 buffers the output signal of a reference signal source 12 supplied from the reference signal line 15-1, and outputs a reference signal S1.

The amplifier 132 has the input connected to the output of the buffer 133, and an output connected to the reference signal connection node 103 via the switch 112. The amplifier 132 outputs a reference signal S2 obtained by amplifying, with a gain G2 (for example, ½″), the reference signal S1 input from the buffer 133. The operations of other components are the same as those in the 11th embodiment.

That is, the buffer 133 outputs the reference signal S1 having the same level as that of the output signal of the reference signal source 12, and the amplifier 132 outputs the reference signal S2 having a level obtained by attenuating the level of the reference signal S1 by ½". As a result, when the level of the reference signal S2 becomes ½" the level of the reference signal S1, and the reference signal source 12 outputs a signal with a ramp voltage, it is possible to obtain, as the reference signals S1 and S2, ramp signals having different voltage gradients, as shown in FIG. 11.

The buffer 133 is arranged, thus regardless of the pixel signal level of each column, the load of the reference signal line 15-1 does not vary. As a result, it is possible to obtain the same effects as those in the 11th embodiment.

Although the gain G2 of the amplifier 132 is set to ½" in the above-described example, the gain is not limited to it. It is also possible to obtain the same effects by, for example, setting the gain G2 to 2", changing the level of the output signal of the reference signal source 12, and inverting the open/closed state of each of the switches 111 and 112.

Fourteenth Embodiment

A solid-state image sensing device and an A/D conversion method therefor according to the 14th embodiment of the present invention will be described below. Note that in the 14th embodiment, the same components as those in the first to 13th embodiments have the same reference numerals, and a detailed description thereof will be omitted.

The arrangement of a selection circuit 31 according to the 14th embodiment will be described with reference to a circuit diagram shown in FIG. 22. The arrangement in the 14th embodiment is different from that shown in FIG. 21 in the 13th embodiment, in that capacitances 144 and 145 are connected to the output of a buffer 133 instead of the amplifier 132.

The output of the buffer 133 is connected to a reference signal connection node 103 via the capacitance 144. The reference signal connection node 103 is connected to a ground potential GND via a switch 153, and is connected to one end of the capacitance 145 via a switch 154. The other end of the capacitance 145 is connected to the ground potential GND.

Before an N conversion period, the switch 153 is in an open state and the switch 154 is in a closed state. In this state, a TG 13 outputs a signal RS5 to temporarily set the switch 153 in a closed state, and resets the potential of the reference signal connection node 103.

The buffer 133 outputs a signal having the same level as that of the output signal of a reference signal source 12 supplied via a reference signal line 15-1. If each of the capacitances 144 and 145 has the same capacitance value as that of a load capacitance 201, the level of a reference signal in the reference signal connection node 103 is divided to ½ the level of the signal output from the buffer 133 when the switch 154 is in an open state. Furthermore, the level of a reference signal in the reference signal connection node 103 is divided to ⅓ the level of the signal output from the buffer 133 when the switch 154 is in a closed state. That is, it is possible to obtain, as reference signals, ramp signals having different voltage gradients.

Note that as long as it is possible to obtain appropriate ramp signals as reference signals, the capacitances 144 and 145 and the load capacitance 201 may have different capacitance values. If the capacitance 144 has a capacitance value C1, the capacitance 145 has a capacitance value C2, and the load capacitance 201 has a capacitance value Cx, the division ratio is C1/Cx when the switch 154 is in an open state, and is C1/(C2+Cx) when the switch 154 is in a closed state.

As in the 13th embodiment, the buffer 133 is arranged, thus regardless of the pixel signal level of each column, the load of the reference signal line 15-1 does not vary. As a result, it is possible to obtain the same effects as those in the 11th embodiment.

Fifteenth Embodiment

A solid-state image sensing device and an A/D conversion method therefor according to the 15th embodiment of the present invention will be described below. Note that in the 15th embodiment, the same components as those in the first to 14th embodiments have the same reference numerals, and a detailed description thereof will be omitted.

Figure 23:
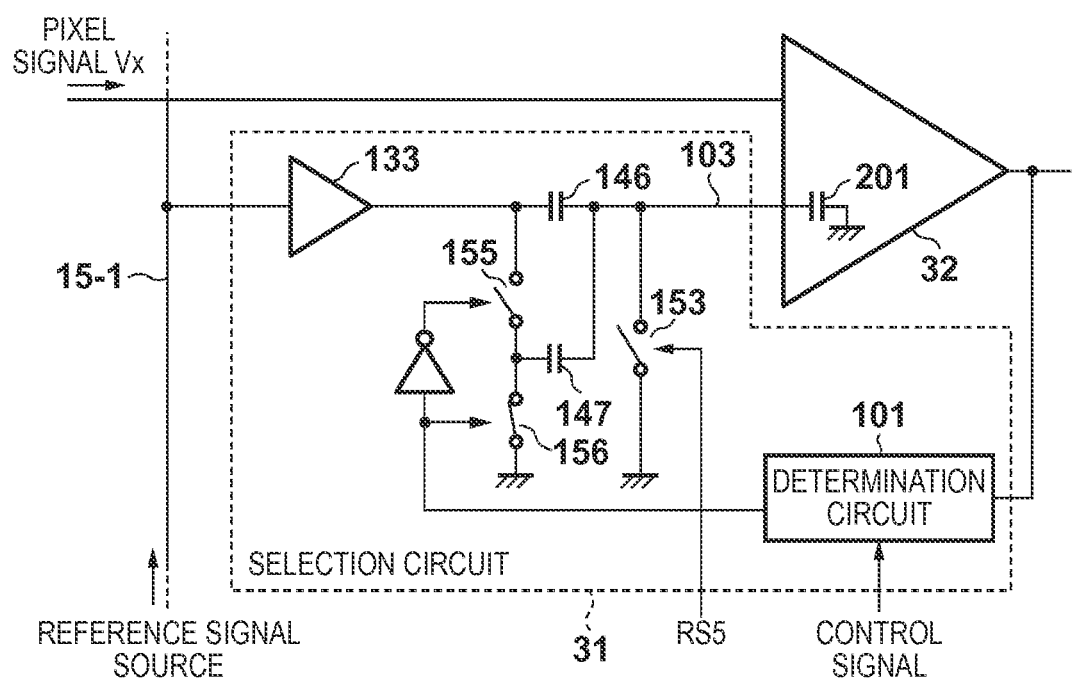
FIG. 23 is a circuit diagram showing the arrangement of a selection circuit according to the fifteenth embodiment.

The arrangement of a selection circuit 31 according to the 15th embodiment will be described with reference to a circuit diagram shown in FIG. 23. The arrangement in the 15th embodiment is different from that shown in FIG. 21 in the 13th embodiment, in that capacitances 146 and 147 are connected to the output of a buffer 133 instead of the amplifier 132.

The output of the buffer 133 is connected to a reference signal connection node 103 via the capacitance 146, and to one end of a switch 155. The other end of the switch 155 is connected to one end of a switch 156, and the other end of the switch 156 is connected to a ground potential GND. Furthermore, the reference signal connection node 103 is connected to the connection node of the switches 155 and 156 via the capacitance 147. The operations of other components are the same as those in the 13th embodiment.

Before N conversion, the switches 153 and 155 are in an open state and the switch 156 is in a closed state. In this state, a TG 13 outputs a signal RS5 to temporarily set the switch 153 in a closed state, and resets the potential of the reference signal connection node 103.

The buffer 133 outputs a signal having the same level as that of the output signal of a reference signal source 12 supplied via a reference signal line 15-1. If each of the capacitances 146 and 147 has the same capacitance value as that of a load capacitance 201, the level of a reference signal in the reference signal connection node 103 is divided to ⅓ the level of the signal output from the buffer 133 when the switch 155 is in an open state and the switch 156 is in a closed state. Furthermore, the level of a reference signal in the reference signal connection node 103 is divided to ⅔ the level of the signal output from the buffer 133 when the switch 155 is in a closed state and the switch 156 is in an open state. That is, it is possible to obtain, as reference signals, ramp signals having different voltage gradients.

Note that as long as it is possible to obtain appropriate ramp signals as reference signals, the capacitances 146 and 147 and the load capacitance 201 may have different capacitance values. If the capacitance 146 has a capacitance value C1, the capacitance 147 has a capacitance value C2, and the load capacitance 201 has a capacitance value Cx, the division ratio is C1/(C1+C2+Cx) when the switch 155 is in an open state and the switch 156 is in a closed state. The division ratio is (C1+C2)/(C1+C2+Cx) when the switch 155 is in a closed state and the switch 156 is in an open state.

As in the 13th embodiment, the buffer 133 is arranged, thus regardless of the pixel signal level of each column, the load of the reference signal line 15-1 does not vary. As a result, it is possible to obtain the same effects as those in the 11th embodiment.

Sixteenth Embodiment

A solid-state image sensing device and an A/D conversion method therefor according to the 16th embodiment of the present invention will be described below. Note that in the 16th embodiment, the same components as those in the first to 15th embodiments have the same reference numerals, and a detailed description thereof will be omitted.

Figure 24:
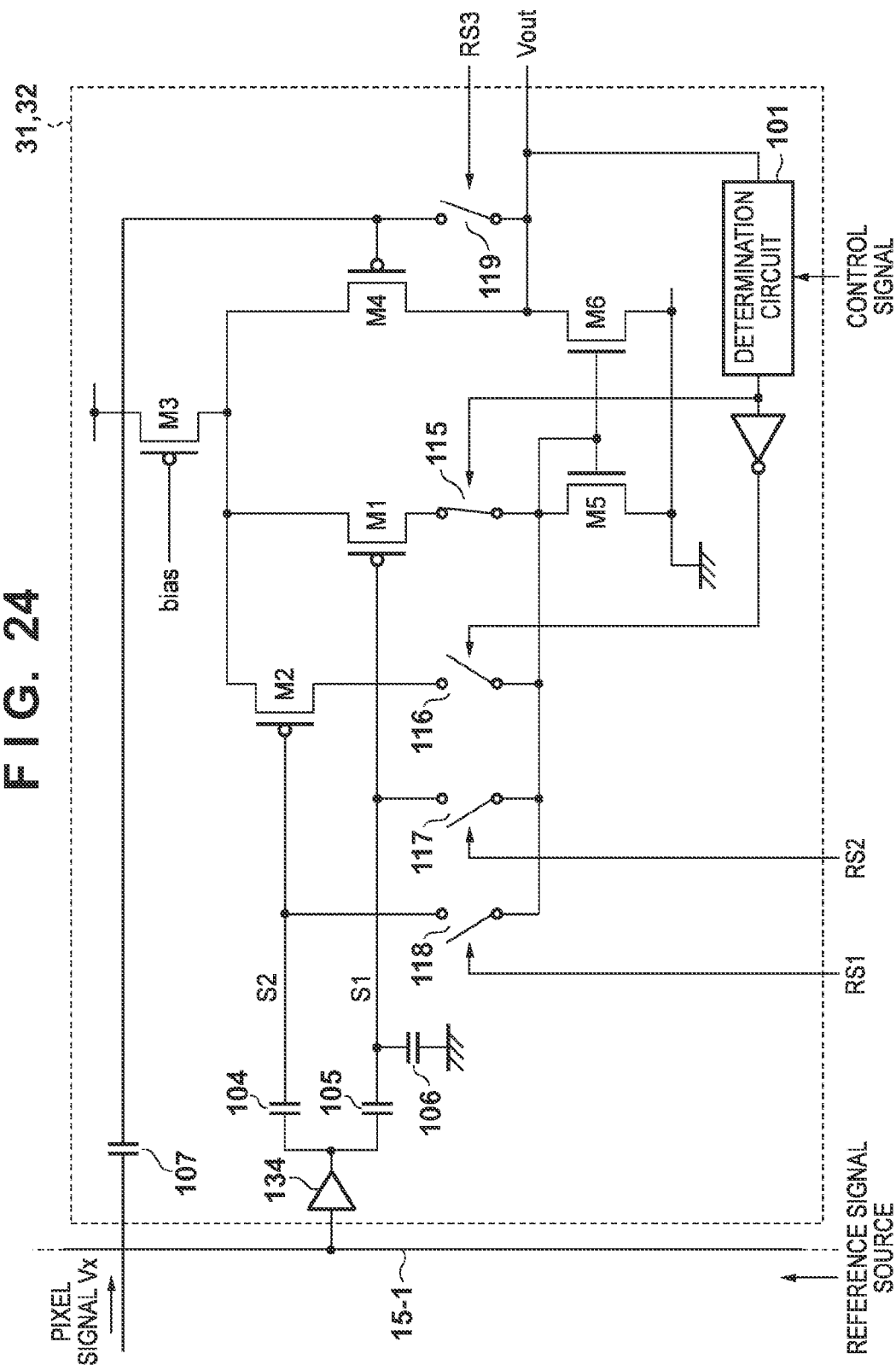
FIG. 24 is a circuit diagram showing the arrangement of a selection circuit and a comparator according to the sixteenth embodiment.

The arrangement of a selection circuit 31 and a comparator 32 according to the 16th embodiment will be described with reference to a circuit diagram shown in FIG. 24. In the 16th embodiment, part of the selection circuit 31 is included within the arrangement of the comparator 32. The arrangement in the 16th embodiment is different from that shown in FIG. 14 in the eighth embodiment, in that a buffer 134 is arranged between a reference signal line 15-1 and the connection node of capacitances 104 and 105.

The buffer 134 buffers the output signal of a reference signal source 12. The operations of other components are the same as those in the eighth embodiment.

The buffer 134 is arranged, thus regardless of the pixel signal level of each column, the load of the reference signal line 15-1 does not vary. As a result, it is possible to obtain the same effects as those in the eighth embodiment.

Furthermore, since the buffer 134 is inserted between the reference signal line 15-1 and the input of the comparator 32, the influence on the output of the reference signal source 12 when the comparator 32 outputs a determination result Vout is suppressed, thereby preventing the accuracy of A/D conversion from decreasing.

Seventeenth Embodiment

A solid-state image sensing device and an A/D conversion method therefor according to the 17th embodiment of the present invention will be described below. Note that in the 17th embodiment, the same components as those in the first to 16th embodiments have the same reference numerals, and a detailed description thereof will be omitted.

Figure 25:
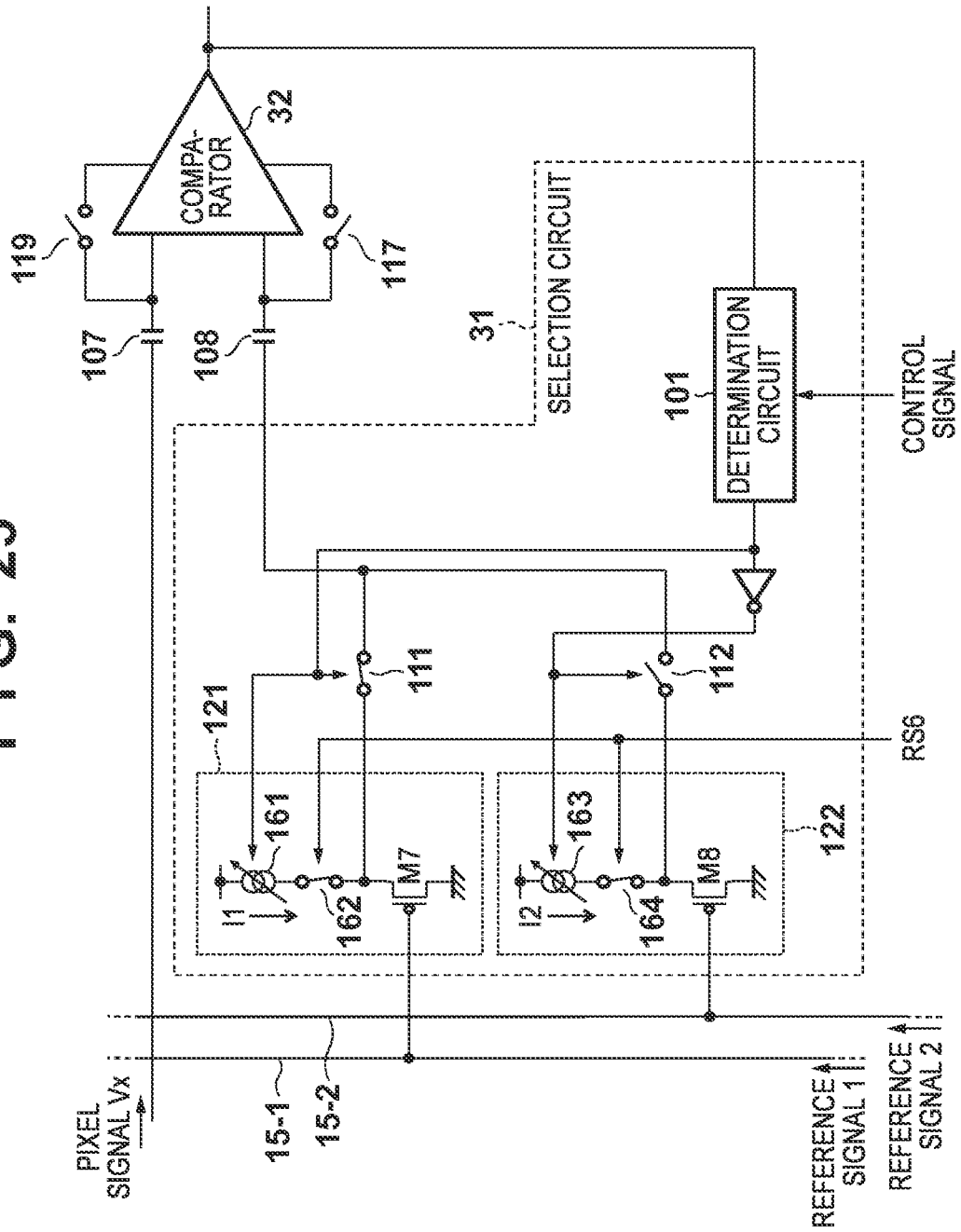
FIG. 25 is a circuit diagram showing the arrangement of a selection circuit according to the seventeenth embodiment.

The arrangement of a selection circuit 31 according to the 17th embodiment will be described with reference to a circuit diagram shown in FIG. 25. In the 17th embodiment, the practical arrangement of the buffers 121 and 122 shown in FIG. 16 according to ninth embodiment will be described. The buffers 121 and 122 will be explained below.

The buffer 121 includes a transistor M7, a current source 161, and a switch 162. The transistor M7 has a source connected, via the switch 162, to the variable current source 161 whose one end is connected to a power supply, and a drain connected to a ground potential GND. The gate of the transistor M7 serves as the input terminal of the buffer 121, and the source of the transistor M7 serves as the output terminal of the buffer 121.

Similarly, the buffer 122 includes a transistor M8, a current source 163, and a switch 164. The transistor M8 has a source connected, via the switch 164, to the variable current source 163 whose one end is connected to a power supply, and a drain connected to the ground potential GND. The gate of the transistor M8 serves as the input terminal of the buffer 122, and the source of the transistor M8 serves as the output terminal of the buffer 122.

A signal RS6 output from a TG 13 controls the open/closed state of each of the switches 162 and 164. During a period from a reset period until S conversion ends, the switches 162 and 164 are in a closed state. While the switches 162 and 164 are in the closed state, the transistors M7 and M8 form a source follower, and the buffer functions of the buffers 121 and 122 are active.

During a period other than a period from the reset period until S conversion ends, the switches 162 and 164 are in an open state, and the buffer functions of the buffers 121 and 122 are inactive. The current consumption, therefore, decreases by a current to be consumed by the buffers 121 and 122. Furthermore, it is possible to control the switches 162 and 164 independently of each other, and to stop the operation of the buffer 122 during a determination period.

A determination circuit 101 controls an output current I1 of the variable current source 161 and an output current I2 of the variable current source 163 in synchronism with the open/closed state of each of switches 111 and 112. If the switch 111 is in a closed state and the switch 112 is in an open state, the output of the buffer 121 is connected to a reference signal connection node 103, and the output of the buffer 122 is not connected to the reference signal connection node 103. In this case, since the output of the buffer 121 is connected to a capacitive load including a series circuit of the capacitance 108 and the load capacitance 201, the current I1 of the variable current source 161 is set to a current value large enough to charge the capacitive load. On the other hand, since the output of the buffer 122 is not connected to any load, the current I2 of the variable current source 163 is set to a value smaller than the current I1 (I1>I2).

If the switch 111 is in an open state and the switch 112 is in a closed state, the output of the buffer 121 is not connected to any load, the connection destination of the output of the buffer 122 is switched to the capacitive load. The current I2, therefore, is set to a current value large enough to charge the capacitive load, and the current I1 is set to a value smaller than the current I2 (I1<I2).

Note that if the current I1 or I2 under no load condition is set to an excessively small value, the capacitance of the input of the buffer 121 or 122 significantly varies when switching the open/closed state of each of the switches 111 and 112, thereby causing load variations of reference signal lines 15-1 and 15-2. It is, therefore, necessary to set an increase/decrease in the current I1 or I2 to satisfy the required accuracy of A/D conversion.

Switches 117 and 119 are temporarily set in a closed state under the control of the TG 13 in a reset operation before N conversion to reset the potential of the input of a comparator 32.

Eighteenth Embodiment

A solid-state image sensing device and an A/D conversion method therefor according to the 18th embodiment of the present invention will be described below. Note that in the 18th embodiment, the same components as those in the first to 17th embodiments have the same reference numerals, and a detailed description thereof will be omitted.

Figure 26:
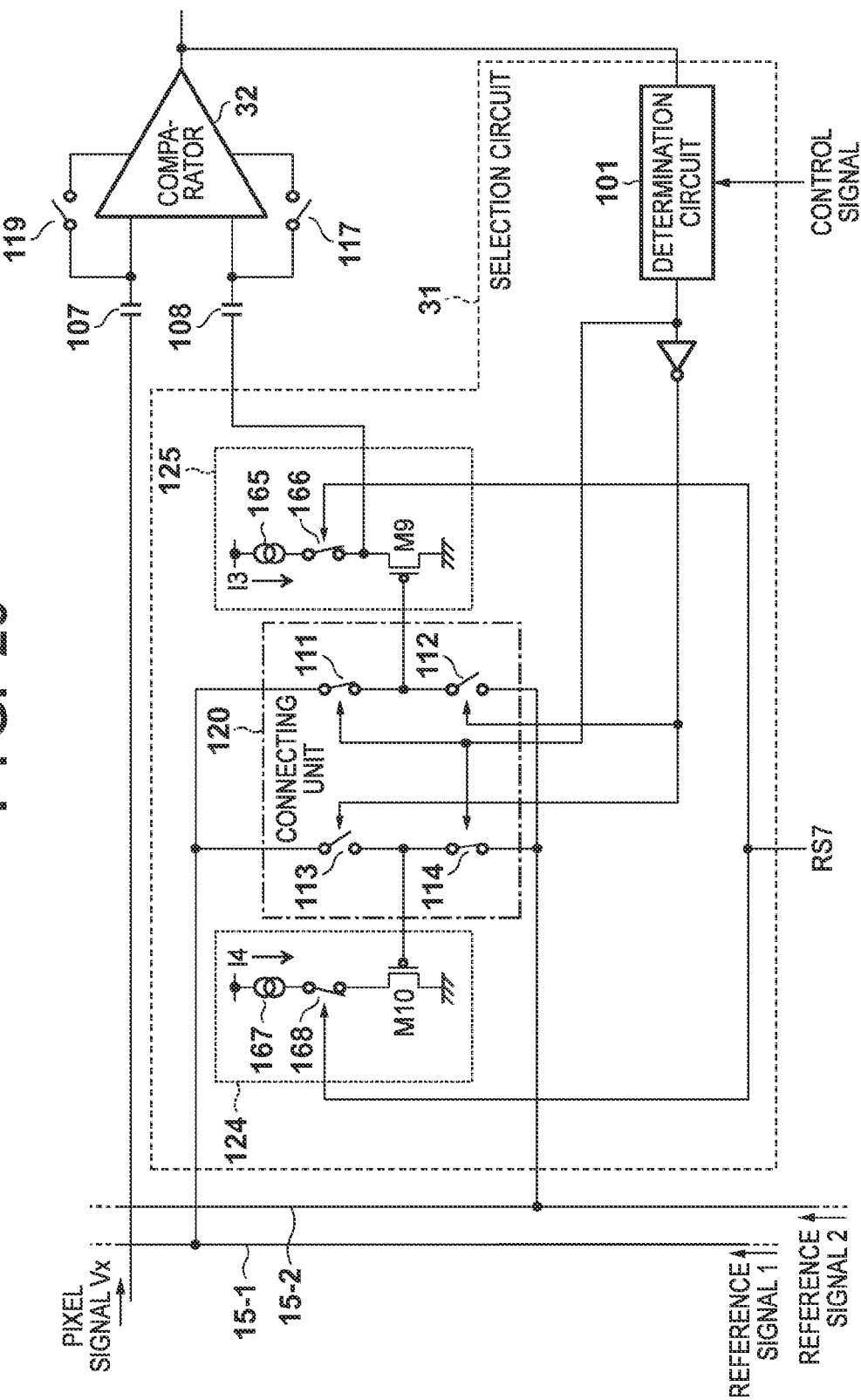
FIG. 26 is a circuit diagram showing the arrangement of a selection circuit according to the eighteenth embodiment.

The arrangement of a selection circuit 31 according to the 18th embodiment will be described with reference to a circuit diagram shown in FIG. 26. In the 18th embodiment, the practical arrangement of the buffers 123 and 124 shown in FIG. 17 according to 11th embodiment will be described. The buffers 123 and 124 will be explained below.

The buffer 123 includes a transistor M9, a current source 165, and a switch 166. The transistor M9 has a source connected, via the switch 166, to the current source 165 whose one end is connected to a power supply, and a drain connected to a ground potential GND. The gate of the transistor M9 serves as the input terminal of the buffer 123, and the source of the transistor M9 serves as the output terminal of the buffer 123.

Similarly, the buffer 124 includes a transistor M10, a current source 167, and a switch 168. The transistor M10 has a source connected, via the switch 168, to the current source 167 whose one end is connected to a power supply, and a drain connected to the ground potential GND. The gate of the transistor M10 serves as the input terminal of the buffer 124. The source of the transistor M10 is only connected to the switch 168, and the buffer 124 functions as a dummy circuit for suppressing load variations of reference signal lines 15-1 and 15-2, as described above in the 11th embodiment.

A signal RS7 output from a TG 13 controls the open/closed state of each of the switches 166 and 168. During a period from a reset period until S conversion ends, the switches 166 and 168 are in a closed state. While the switch 166 is in the closed state, the transistor M9 forms a source follower and the buffer function of the buffer 123 is active. On the other hand, while the switch 168 is in the closed state, the transistor M10 forms a source follower and the dummy function of the buffer 124 is active.

During a period other than a period from the reset period until S conversion ends, the switches 166 and 168 are in an open state, and the buffer functions of the buffers 123 and 124 are inactive. The current consumption, therefore, decreases by a current to be consumed by the buffers 123 and 124. Furthermore, it is possible to control the switches 166 and 168 independently of each other, and to stop the operation of the buffer 124 during a determination period.

Since the output of the buffer 123 is connected to a capacitive load including a series circuit of capacitance 108 and a load capacitance 201, a current I3 of the current source 165 is set to a current value large enough to charge the capacitive load. On the other hand, since the output of the buffer 124 is not connected to any load, a current I4 of the current source 167 is set to a value smaller than the current I3 (I3>I4).

If, however, the current I4 is set to an excessively small value, the difference between the capacitance of the input of the buffer 123 and that of the input of the buffer 124 becomes large, thereby causing load variations of the reference signal lines 15-1 and 15-2. It is, therefore, necessary to set the value of the current I4 to satisfy the required accuracy of A/D conversion.

Nineteenth Embodiment

A solid-state image sensing device and an A/D conversion method therefor according to the 19th embodiment of the present invention will be described below. Note that in the 19th embodiment, the same components as those in the first to 18th embodiments have the same reference numerals, and a detailed description thereof will be omitted.

The arrangement of an image sensor 100 serving as the solid-state image sensing device according to the 19th embodiment will be described with reference to a circuit diagram shown in FIG. 27. The arrangement of the image sensor 100 according to the 19th embodiment is different from that of the image sensor 100 shown in FIG. 1, in that a back-gate control unit 14 which receives a signal from a reference signal line 15-1 and outputs a signal VB is arranged.

Figure 28:
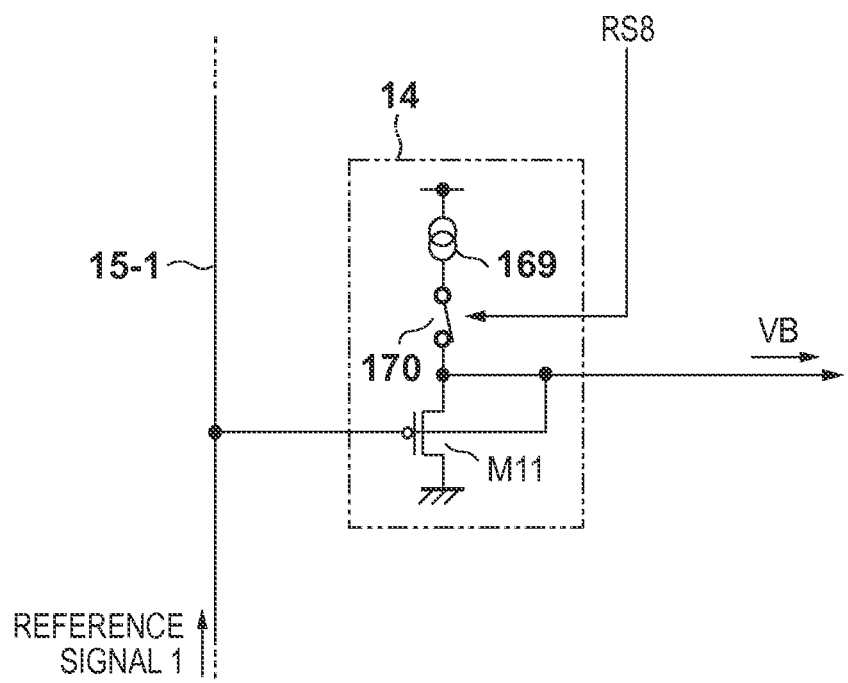
FIG. 28 is a circuit diagram showing the arrangement of the back-gate control.

FIG. 28 is a circuit diagram showing the arrangement of the back-gate control unit 14.

The back-gate control unit 14 includes a transistor M11, a current source 169, and a switch 170. The transistor M11 has a gate which is connected to the reference signal line 15-1 and to which reference signal 1 is input. The transistor M11 has a drain connected to a ground potential GND. The source and back gate (or bulk) of the transistor M11 are connected, via the switch 170, to the current source 169 whose one end is connected to a power supply.

A signal RS8 output from a TG 13 controls the open/closed state of the switch 170. During a period from a reset period until S conversion ends, the switch 170 is in a closed state. While the switch 170 is in the closed state, the transistor M11 forms a source follower, and the back-gate control unit 14 outputs the signal VB generated by buffering reference signal 1.

Figure 29:
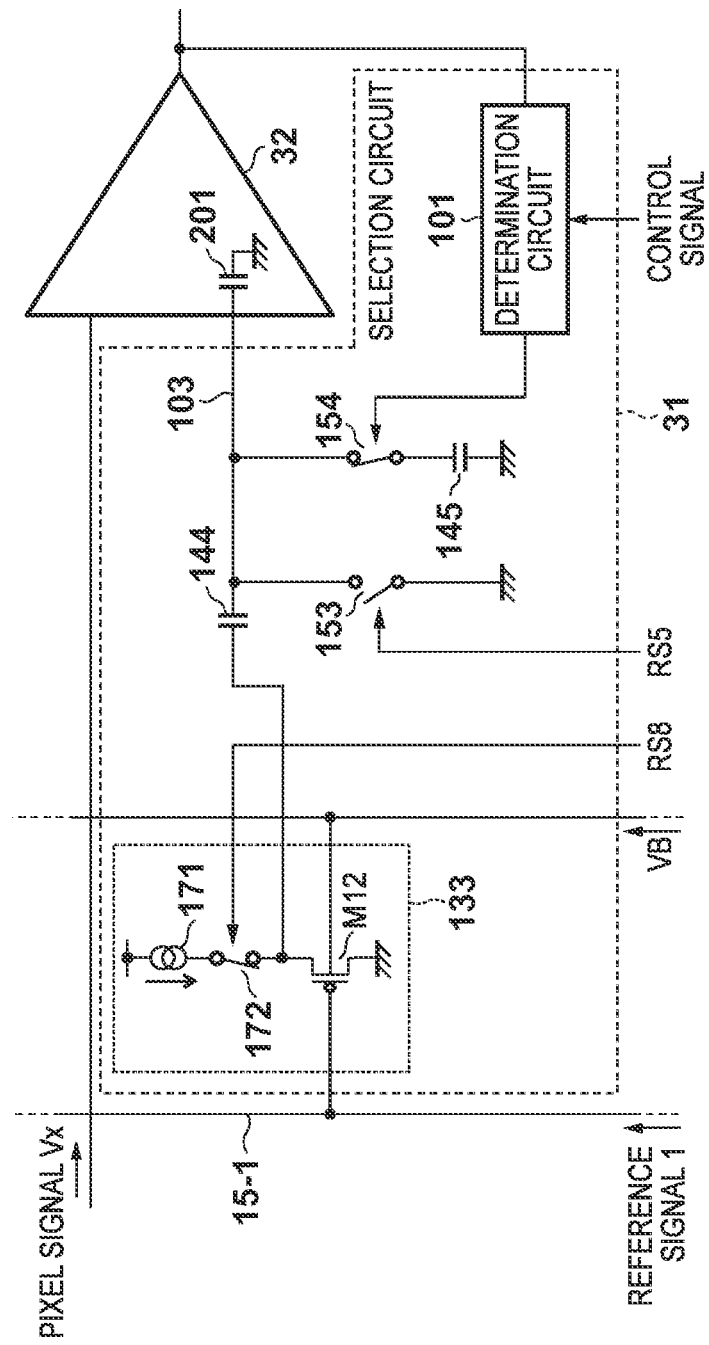
FIG. 29 is a circuit diagram showing the arrangement of a selection circuit according to the nineteenth embodiment.

The arrangement of a selection circuit 31 according to the 19th embodiment will be described with reference to a circuit diagram shown in FIG. 29. The selection circuit 31 according to the 19th embodiment shows the practical arrangement of the buffer 133 shown in FIG. 22 according to the 14th embodiment. The buffer 133 will be explained below.

The buffer 133 includes a transistor M12, a current source 171, and a switch 172. The transistor M12 has a source connected, via the switch 172, to the current source 171 whose one end is connected to a power supply, and a drain connected to a ground potential GND. The gate of the transistor M12 serves as the input terminal of the buffer 133, and the source of the transistor M12 serves as the output terminal of the buffer 133. Furthermore, the signal VB is input to the back gate of the transistor M12.

The signal RS8 output from the TG 13 controls the open/closed state of the switch 172. During a period from a reset period until S conversion ends, the switch 172 is in a closed state. While the switch 172 is in the closed state, the transistor M12 forms a source follower and the buffer function of the buffer 133 is active.

If the buffer function is active, a voltage higher than that of reference signal 1 by about the threshold voltage of the transistor M12 is output as the source voltage of the transistor M12. A voltage higher than that of reference signal 1 by about the threshold voltage of the transistor M11 of the back-gate control unit 14 is input to the back gate of the transistor M12 as the signal VB.

The threshold voltages of the transistors M11 and M12 are set to the same value. As a result, it is possible to control the back gate potential and source potential of the transistor M12 to the same potential, and to avoid the substrate bias effect in the source follower, thereby reducing deterioration in linearity due to insertion of a buffer.

Figure 22:
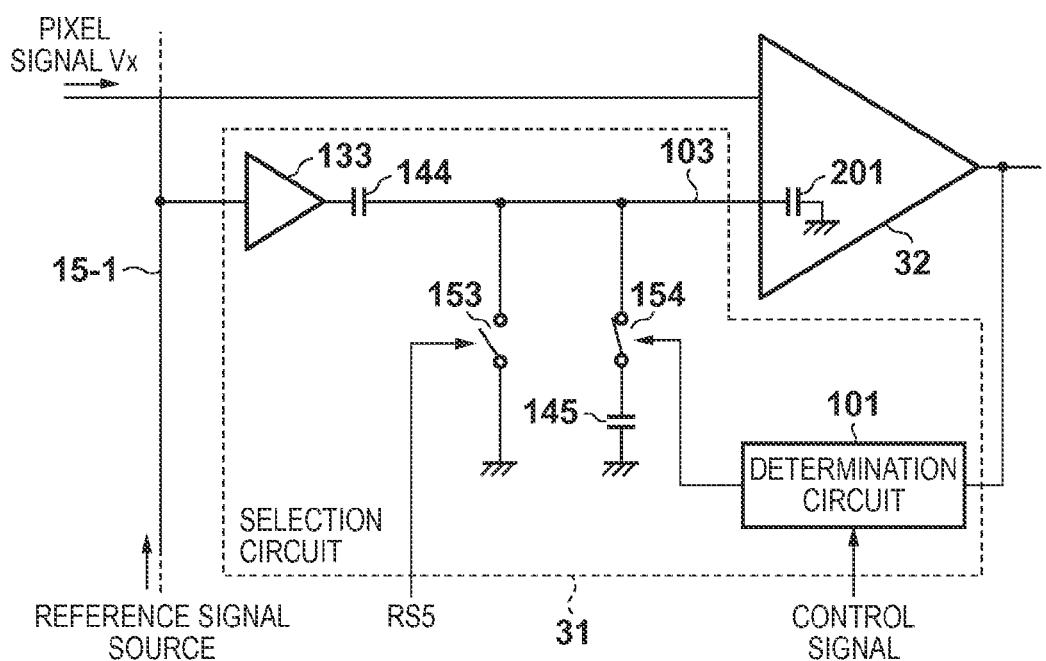
FIG. 22 is a circuit diagram showing the arrangement of a selection circuit according to the fourteenth embodiment.

Although the buffer 133 shown in FIG. 22 according to the 14th embodiment has been described, the same buffer arrangement can be used to add the back-gate control unit 14 in the 13th, 15th, and 16th embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-026422, filed Feb. 9, 2012, and 2013-005708, filed Jan. 16, 2013, which are hereby incorporated by reference herein in their entirety.

What is claimed is:

1. A solid-state image sensing device having plural sets of a unit pixel outputting a pixel signal and a conversion unit converting the pixel signal into a digital signal, the device comprising:
   a plurality of signal lines;
   a reference signal generator configured to generate a plurality of reference signals and to supply each of the plurality of reference signals through a corresponding one of the plurality of signal lines; and
   a counter configured to count a clock,
   wherein the conversion unit of each set comprises:
      a comparator, including an input for one of the plurality of reference signals, configured to compare a level of the reference signal inputted by the input with a level of the pixel signal;

a selector configured to select a signal line among the plurality of signal lines as a selected signal line to be connected to the input of the comparator; and a connecting unit configured to connect the selected signal line to the input of the comparator and to connect a load to another signal line of the plurality of signal lines.

2. The device according to claim 1, wherein the load has a capacitance value equal to a capacitance value existing in the input of the comparator.

3. The device according to claim 1, wherein the load is a transistor having the same size as that of a transistor arranged in the input of the comparator.

4. The device according to claim 1, wherein the reference signal on the signal line selected by the selector is input to the comparator through a first buffer circuit.

5. The device according to claim 4, wherein at least a period in which the comparator compares the level of the reference signal with the level of the pixel signal, the first buffer circuit is operated.

6. The device according to claim 5, wherein the load is a second buffer circuit that is substantially equivalent to the first buffer circuit, and a drive current of the second buffer circuit is less than a drive current of the first buffer circuit.

7. The device according to claim 5, wherein before a period during which the pixel signal is converted into the digital signal, the selector selects, among the plurality of signal lines, a signal line, to which the reference signal generator supplies a determination reference voltage instead of one of the plurality of reference signals, so as to be connected to the input of the comparator, and during the period, the selector selects a signal line to be connected to the input of the comparator based on a result of comparison between the determination reference voltage and the level of the pixel signal by the comparator.

8. A solid-state image sensing device having a plurality of unit pixels arranged in rows and columns and each configured to output a pixel signal, and a plurality of conversion units each arranged corresponding to one of the columns of the plurality of unit pixels and each configured to convert the pixel signal into a digital signal, the device comprising:

a first signal line and a second signal line;

a reference signal generator configured to generate a plurality of reference signals including a first reference signal and a second reference signal and to supply the first reference signal through the first signal line and the second reference signal through the second signal line, wherein each of the plurality of conversion units comprises:

a comparator, including an input for one of the first and second reference signals, configured to compare a level of the first or second reference signal with a level of the pixel signal during a comparison period;

a first buffer connected to the input of the comparator;

a second buffer unconnected to the input of the comparator; and a connecting unit configured to, during the comparison period, connect one of the first signal line and the second signal line to the first buffer and connect another of the first signal line and the second signal line to the second buffer.

9. The device according to claim 8, wherein each of the first and second buffers comprises a current source and a MOS transistor connected to the connecting unit and the current source, and wherein a current value supplied to the MOS transistor by the current source in the second buffer is smaller than a current value supplied to the MOS transistor by the current source in the first buffer.

10. The device according to claim 9, wherein each of the first and second buffers comprises a switch between the MOS transistor and the current source, and the switch of the first buffer and the switch of the second buffer are controlled by a same signal.

11. A solid-state image sensing device having a plurality of unit pixels arranged in rows and columns and each configured to output a pixel signal, and a plurality of conversion units each arranged corresponding to one of the columns of the plurality of unit pixels and each configured to convert the pixel signal into a digital signal, the device comprising:

a signal line;

a reference signal generator configured to generate a reference signal and to supply the reference signal through the signal line; and a back-gate control unit that comprises a MOS transistor and a current source, wherein each of the plurality of conversion units comprises:

a comparator, including an input for the reference signal, configured to compare a level of the reference signal with a level of the pixel signal during a comparison period; and a buffer connected to the input of the comparator, and wherein the buffer comprises a MOS transistor and a current source, a gate of the MOS transistor of the back-gate control unit is connected to the signal line, and a back-gate of the MOS transistor of the back-gate control unit is connected to a back-gate of the MOS transistor of the buffer.

12. The device according to claim 8, further comprising a determination circuit configured to control the connecting unit, wherein the first reference signal has a smaller voltage gradient than a voltage gradient of the second reference signal, either the first or second signal line can supply a determination reference voltage instead of the first or second reference signal, before the comparison period, the determination circuit controls the connecting unit to connect, in a first state, either the first or second signal line supplying the determination reference voltage to the first buffer so that the comparator performs comparison processing to compare the level of the pixel signal with the determination reference voltage, and during the comparison period, the determination circuit controls the connecting unit to connect, in a second state, the second signal line to the first buffer and to connect the first signal line to the second buffer in a case where a result of the comparison processing indicates that the level of the pixel signal is larger than the determination reference voltage, and controls the connecting unit to connect, in a third state, the first signal line to the first buffer and the second signal line to the second buffer in another case where the result of the comparison processing indicates that the level of the pixel signal is not lager than the determination reference voltage.

13. A solid-state image sensing device having a plurality of unit pixels arranged in rows and columns and each configured to output a pixel signal, and a plurality of conversion units each arranged corresponding to one of the columns of the plurality of unit pixels and each configured to convert the pixel signal into a digital signal, the device comprising:

a reference signal generator configured to generate a plurality of reference signals and to supply the plurality of reference signals, wherein each of the plurality of conversion units comprises:
- a plurality of signal lines, which include at least a first and second signal lines, each configured to supply one of the plurality of reference signals;
- a comparator, including an input for one of the plurality of reference signals, configured to compare a level of one of the plurality of reference signals with a level of the pixel signal during a comparison period; and
- a connecting unit configured to make a state in which one of the first signal line and the second signal line is connected to the input of the comparator and another of the first signal line and the second signal line is connected to a load, during the comparison period.

14. The device according to claim 13, wherein, before the comparison period during which the pixel signal is converted into the digital signal, the connecting unit is configured to connect one of the plurality of signal lines to the input of the comparator, and the one of the plurality of signal line to be connected to the input of the comparator supplies a determination reference voltage generated by the reference signal generator instead of one of the plurality of reference signals, and during the comparison period, the connecting unit is configured to connect one of the plurality of signal lines to the input of the comparator based on a comparison result of the comparator that compares the level of the pixel signal with the determination reference voltage.

15. The device according to claim 13, wherein the load comprises a transistor having a same size as that of a transistor disposed in the input of the comparator.

* * * * *